United States Patent
Riley et al.

(10) Patent No.: US 12,165,690 B2
(45) Date of Patent: Dec. 10, 2024

(54) ADJUSTING REFRESH RATE DURING SELF-REFRESH STATE

(71) Applicant: Micron Technology, Inc., Boise, ID (US)

(72) Inventors: John E. Riley, McKinney, TX (US); Joo-Sang Lee, Frisco, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 17/849,100

(22) Filed: Jun. 24, 2022

(65) Prior Publication Data
US 2023/0420024 A1  Dec. 28, 2023

(51) Int. Cl.
*G11C 11/406* (2006.01)
*G11C 11/4074* (2006.01)

(52) U.S. Cl.
CPC .. *G11C 11/40615* (2013.01); *G11C 11/40603* (2013.01); *G11C 11/40618* (2013.01); *G11C 11/4074* (2013.01)

(58) Field of Classification Search
CPC ........ G11C 11/40615; G11C 11/40603; G11C 11/40618; G11C 11/4074; G11C 29/50012; G11C 29/023; G11C 29/028
See application file for complete search history.

(56) References Cited

U.S. PATENT DOCUMENTS

| | | | | |
|---|---|---|---|---|
| 6,134,167 A | * | 10/2000 | Atkinson | G11C 11/40626 365/222 |
| 2006/0067150 A1 | * | 3/2006 | Jain | G11C 11/406 365/222 |
| 2021/0020229 A1 | * | 1/2021 | Xie | G11C 11/1675 |
| 2022/0051744 A1 | * | 2/2022 | Huang | G11C 29/4401 |
| 2023/0420023 A1 | * | 12/2023 | Hilde | G11C 11/40615 |

* cited by examiner

*Primary Examiner* — Jay W. Radke
(74) *Attorney, Agent, or Firm* — Holland & Hart LLP

(57) ABSTRACT

Methods, systems, and devices for adjusting a refresh rate during a self-refresh state are described. A memory system may enter a self-refresh state and execute a first set of refresh operations on a set of rows of memory cells at the memory system according to a first rate. The memory system may determine, based on executing the first set of refresh operations, that a counter associated with the set of refresh operations satisfies a threshold for a second time while the memory system is in the self-refresh state. In response to the counter satisfying the threshold for the second time, a flip-flop circuit at the memory system may modify an output of the flip-flop circuit and the memory system may decrease the rate for executing the refresh operations to a second rate based on the modified output of the flip-flop circuit.

20 Claims, 8 Drawing Sheets

ADJUSTING REFRESH RATE DURING SELF-REFRESH STATE

FIELD OF TECHNOLOGY

The following relates to one or more systems for memory, including adjusting a refresh rate during a self-refresh state.

BACKGROUND

Memory systems are widely used to store information in various electronic devices such as computers, user devices, wireless communication devices, cameras, digital displays, and the like. Information is stored by programming memory cells within a memory system to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory system. To store information, a component may write (e.g., program, set, assign) the state in the memory system.

Various types of memory systems exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory systems, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
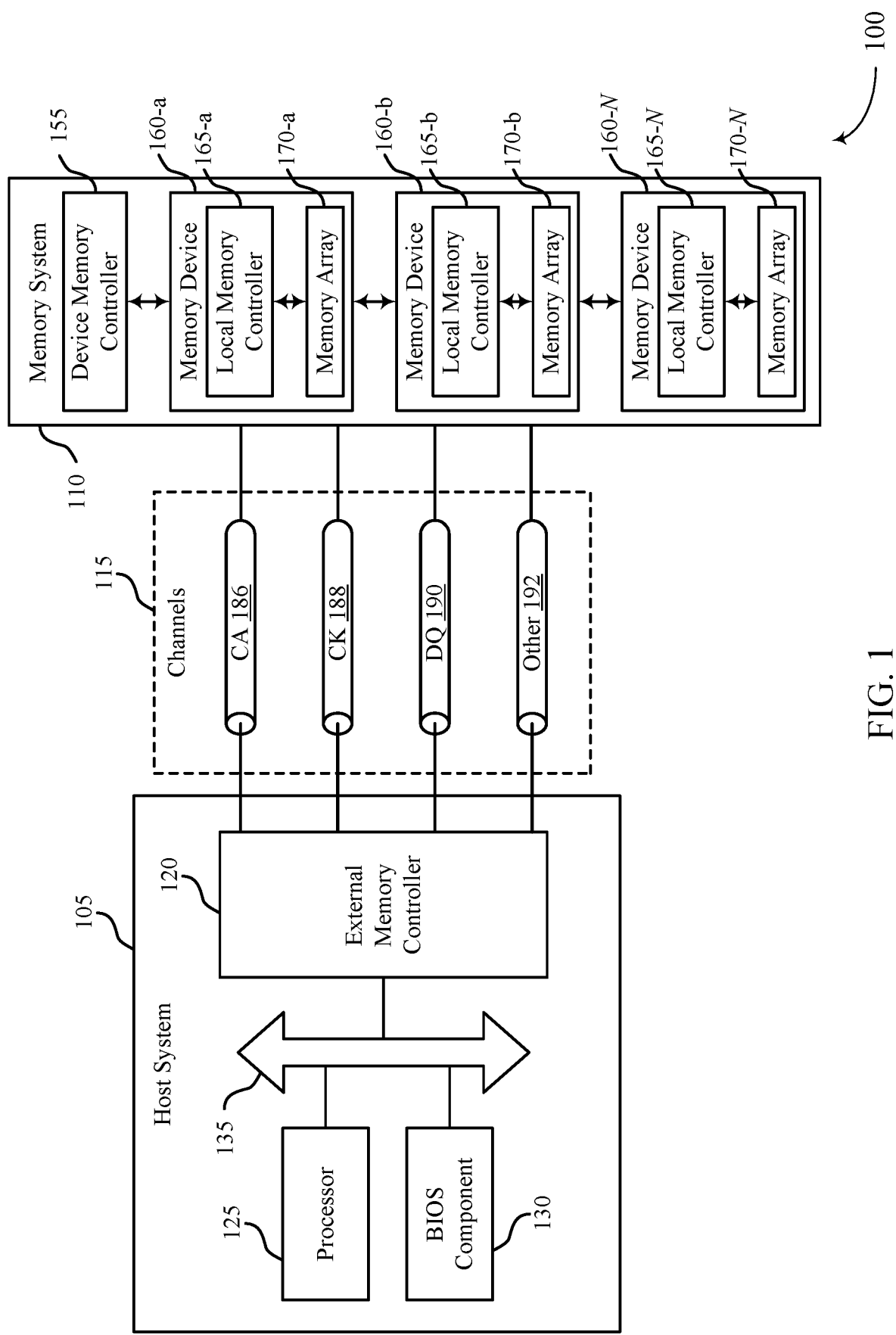
FIG. 1 illustrates an example of a system that supports adjusting a refresh rate during a self-refresh state in accordance with examples as disclosed herein.

A memory system may perform refresh operations on one or more rows of memory cells at the memory system, which may improve a reliability of data stored by the corresponding rows of memory cells. To perform a refresh operation, a memory system may execute a read operation on a row of memory cells to detect data stored by that row and subsequently perform a write operation on the same row of memory cells to rewrite the data to the row of memory cells. In some cases, the memory system may execute refresh operations in response to receiving one or more refresh commands from a host system. Additionally, or alternatively, the memory system may execute refresh operations based on internally-generated refresh commands. For example, the memory system may enter a self-refresh state and execute refresh operations (e.g., in response to internally-generated refresh commands) on the rows of memory cells according to a refresh rate.

In some cases, a power consumption of the memory system operating in the self-refresh state may be based on the refresh rate. For example, the memory system may consume more power executing refresh operations according to a higher rate as compared to executing refresh operations according to a lower rate. However, performing refresh operations at a lower rate may lead to decreased reliability. In some cases, the memory system may be able to conserve power by switching between a higher refresh rate and a lower refresh rate. Thus, the memory system may perform some refresh operations at a higher rate and once reliability has been established switch to a lower refresh rate to conserve power. However, some memory systems may not provide for transitioning between refresh rates while in the self-refresh state.

Accordingly, the techniques as described herein provide for decreasing a power consumption associated with executing refresh operations in a self-refresh state while maintaining a reliability associated with the self-refresh state. Specifically, the memory system may enter a self-refresh state and begin executing refresh operations according to a first refresh rate (e.g., a relatively fast refresh rate). Once the memory system determines that each row of memory cells at the memory system is refreshed according to the first refresh rate, the memory system may decrease the refresh rate to a second, slower, refresh rate. Thus, the memory system may refresh each row of memory cells at the memory system according to a relatively fast refresh rate, which may preserve a reliability of data stored in the rows of memory cells. Additionally, the memory system may decrease a rate of executing refresh operations in the self-refresh state, which may decrease a power consumption of the memory system while in the self-refresh state (e.g., as compared to a memory system executing refresh operations in the self-refresh state according to a higher rate).

The memory system may rely on circuitry associated with a counter to determine whether each row of memory cells in the memory system have been refreshed according to the first, faster rate while in the self-refresh state (e.g., prior to decreasing the refresh rate to the second, slower refresh rate). For example, the memory system may include a counter, where a value of the counter indicates one of the rows of memory cells in the memory system and a refresh circuit of the memory system executes refresh operations on rows of memory cells based on corresponding values of the counter. For example, the refresh circuit may detect the value of the counter and identify one of the rows of memory cells indicated by the value of the counter. Then, the refresh circuit may execute a refresh operation at the indicated row of memory cells, increment the counter, and execute a next refresh operation on a next row of memory cells (e.g., based on the incremented value of the counter indicating the next row of memory cells).

In some cases, the value of the counter may satisfy a threshold and the memory system may reset the counter. For example, if a value of the counter indicates a last row of memory cells in the memory system (e.g., a row of memory cells associated with a larger value of the counter than other rows of memory cells at the memory system), the value of the counter may satisfy the threshold and the memory system may reset the counter to a value indicating a first row of memory cells in the memory system (e.g., a row of memory cells associated with a smaller value of the counter than other rows of memory cells at the memory system). The memory system may include circuitry (e.g., including two flip-flop circuits) that outputs a signal indicating for the memory system to decrease the refresh rate in response to detecting a second instance of resetting the counter while the memory system is in the self-refresh state. In some cases, outputting signaling indicating for the memory system to decrease the refresh rate after resetting the counter twice may ensure that each row of memory cells at the memory system is refreshed at least once prior to decreasing the refresh rate while operating in a refresh state.

Features of the disclosure are initially described in the context of systems and memory devices as described with reference to FIGS. 1 and 2. Features of the disclosure are described in the context systems, timing diagrams, and circuitry as described with reference to FIGS. 3 through 6. These and other features of the disclosure are further illustrated by and described with reference to an apparatus diagram and a flowchart that relate to adjusting a refresh rate during a self-refresh state as described with reference to FIGS. 7 and 8.

FIG. 1 illustrates an example of a system 100 that supports adjusting a refresh rate during a self-refresh state in accordance with examples as disclosed herein. The system 100 may include a host system 105, a memory system 110, and a plurality of channels 115 coupling the host system 105 with the memory system 110. The system 100 may include one or more memory systems 110, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. The memory system 110 may be a component of the system 100 that is operable to store data for one or more other components of the system 100. In some cases, the memory system 110 may be referred to as a memory device.

Portions of the system 100 may be examples of the host system 105. The host system 105 may be an example of a processor (e.g., circuitry, processing circuitry, a processing component) within a device that uses memory to execute processes. In some examples, the host system 105 may refer to the hardware, firmware, software, or any combination thereof that implements the functions of an external memory controller 120.

A memory system 110 may be an independent device or a component that is operable to provide physical memory addresses space that may be used or referenced by the system 100. In some examples, a memory system 110 may be configurable to work with one or more different types of host systems. The memory system 110 may be operable to store data for the components of the host system 105. In some examples, the memory system 110 (e.g., operating as a secondary-type device to the host system 105, operating as a dependent-type device to the host system 105) may respond to and execute commands provided by the host system 105 through the external memory controller 120.

The host system 105 may include one or more of an external memory controller 120, a processor 125, a basic input/output system (BIOS) component 130, or other components such as one or more peripheral components or one or more input/output controllers. The components of the host system 105 may be coupled with one another using a bus 135. The processor 125 may be operable to provide functionality (e.g., control functionality) for the system 100 or the host system 105. The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105.

The memory system 110 may include a device memory controller 155 and one or more memory devices 160 (e.g., memory chips, memory dies) to support a capacity (e.g., a desired capacity, a specified capacity) for data storage. Each memory device 160 (e.g., memory device 160-*a*, memory device 160-*b*, memory device 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections, one or more rows) of memory cells, with each memory cell being operable to store one or more bits of data. A memory system 110 including two or more memory devices 160 may be referred to as a multi-die memory or a multi-die package or a multi-chip memory or a multi-chip package.

The device memory controller 155 may include components (e.g., circuitry, logic) operable to control operation of the memory system 110. The device memory controller 155 may include hardware, firmware, or instructions that enable the memory system 110 to perform various operations and may be operable to receive, transmit, or execute commands, data, or control information related to the components of the memory system 110. The device memory controller 155 may be operable to communicate with one or more of the external memory controller 120, the one or more memory devices 160, or the processor 125. In some examples, the device memory controller 155 may control operation of the memory system 110 described herein in conjunction with the local memory controller 165 of the memory device 160.

In some examples, the memory system 110 may communicate information (e.g., data, commands, or both) with the host system 105. For example, the memory system 110 may receive a write command indicating that the memory system 110 is to store data received from the host system 105, or receive a read command indicating that the memory system 110 is to provide data stored in a memory device 160 to the host system 105, among other types of information communication. For example, the memory system 110 may receive a refresh command from the host system 105 indicating that the memory system 110 is to execute a refresh operation at the memory devices 160.

A local memory controller 165 (e.g., local to a memory device 160) may include components (e.g., circuitry, logic) operable to control operation of the memory device 160. In some examples, a local memory controller 165 may be operable to communicate (e.g., receive or transmit data or commands or both) with the device memory controller 155. In some examples, a memory system 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof.

The external memory controller 120 may be operable to enable communication of information (e.g., data, commands, or both) between components of the system 100 (e.g., between components of the host system 105, such as the processor 125, and the memory system 110). The external memory controller 120 may process (e.g., convert, translate) communications exchanged between the components of the host system 105 and the memory system 110. In some examples, the external memory controller 120, or other component of the system 100 or the host system 105, or its functions described herein, may be implemented by the processor 125. Although the external memory controller 120 is depicted as being external to the memory system 110, in some examples, the external memory controller 120, or its functions described herein, may be implemented by one or more components of a memory system 110 (e.g., a device memory controller 155, a local memory controller 165) or vice versa.

The components of the host system 105 may exchange information with the memory system 110 using one or more channels 115. Each channel 115 may include one or more signal paths (e.g., a transmission medium, a conductor) between terminals associated with the components of the system 100. Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory system 110 may perform refresh operations at the memory arrays 170 of the memory system 110. To perform a refresh operation, the memory system 110 (e.g., the device memory controller 155, a local memory controller 165) may execute a read operation on a row of memory cells at a memory array 170 to detect data stored by that row. Additionally, the memory system 110 may then perform a write operation on the same row of memory cells at the memory array 170 to rewrite the data to the row of memory cells. In some cases, the memory system 110 may execute refresh operations in response to receiving one or more refresh commands from the host system 105 (e.g., via the CA channel 186). Additionally, or alternatively, the memory system 110 may execute refresh operations based commands generated by a controller of the memory system (e.g., the device memory controller 155, a local memory controller 165). For example, the memory system 110 may enter a self-refresh state and execute refresh operations (e.g., in response to internally-generated refresh commands) on the rows of memory cells in one or more memory arrays 170 according to a refresh rate. Additionally, or alternatively, the memory system 110 may cause one or more memory devices 160 to enter into a self-refresh state. Here, each memory device 160 in the self-refresh state may execute refresh operations on the rows of memory cells in a memory array 170 at the memory device 160.

In some cases, a power consumption of the memory system 110 operating in the self-refresh state may be based on the refresh rate. For example, the memory system 110 may consume more power executing refresh operations according to a higher rate as compared to executing refresh operations according to a lower rate. In some cases, however, decreasing a rate associated with executing refresh operations may result in a decreased reliability of data stored in the rows of memory cells in the memory system 110 (e.g., an increase in one or more errors in the data). That is, upon entering the self-refresh state, a reliability of data stored in each row of memory cells may decrease as an amount of time between entering the self-refresh state and refreshing the corresponding row of memory cells increases. Thus, in cases that the memory system 110 enters the self-refresh state and executes refresh operations according to a relatively slow refresh rate, some rows of memory cells at the memory system may not be refreshed for a correspondingly large amount of time. Here, a reliability of data stored in those rows of memory cells may decrease.

Accordingly, the techniques as described herein provide for decreasing a power consumption associated with executing refresh operations in a self-refresh state while maintaining a reliability associated with the self-refresh state. Specifically, the memory system 110 may enter a self-refresh state and begin executing refresh operations (e.g., at a row of a memory array 170) according to a first refresh rate (e.g., a relatively fast refresh rate). Specifically, the memory system 110 may include a counter, where a value of the counter indicates a row of memory cells in the memory system 110 to be refreshed and a refresh circuit of the memory system 110 executes refresh operations on rows of memory cells based on corresponding values of the counter. For example, the refresh circuit may detect the value of the counter and identify one of the rows of memory cells indicated by the value of the counter. Then, the refresh circuit may execute a refresh operation at the indicated row of memory cells, increment the counter, and execute a next refresh operation on a next row of memory cells (e.g., based on the incremented value of the counter indicating the next row of memory cells).

In some cases, the value of the counter may satisfy a threshold and the memory system 110 may reset the counter. That is, when a value of the counter indicates a last row of memory cells in the memory system 110 (e.g., a row of memory cells associated with a larger value of the counter than other rows of memory cells at the memory system 110), the value of the counter may satisfy the threshold and the memory system 110 may reset the counter to a value indicating a first row of memory cells in the memory system 110 (e.g., a row of memory cells associated with a smaller value of the counter than other rows of memory cells at the memory system 110). The memory system 110 may include circuitry (e.g., including two flip-flop circuits) that outputs a signal indicating for the memory system 110 to decrease the refresh rate in response to detecting a second instance of resetting the counter while the memory system 110 is in the self-refresh state. In some cases, outputting signaling indicating for the memory system 110 to decrease the refresh rate after resetting the counter twice may ensure that each row of memory cells at the memory system 110 is refreshed at least once prior to decreasing the refresh rate.

Thus, the memory system 110 may refresh each row of memory cells at the memory system 110 according to a relatively fast refresh rate, which may preserve a reliability of data stored in the rows of memory cells. Additionally, the memory system 110 may decrease a rate of executing refresh operations in the self-refresh state, which may decrease a power consumption of the memory system 110 while in the self-refresh state (e.g., as compared to a memory system 110 executing refresh operations in the self-refresh state according to a higher rate).

Figure 2:
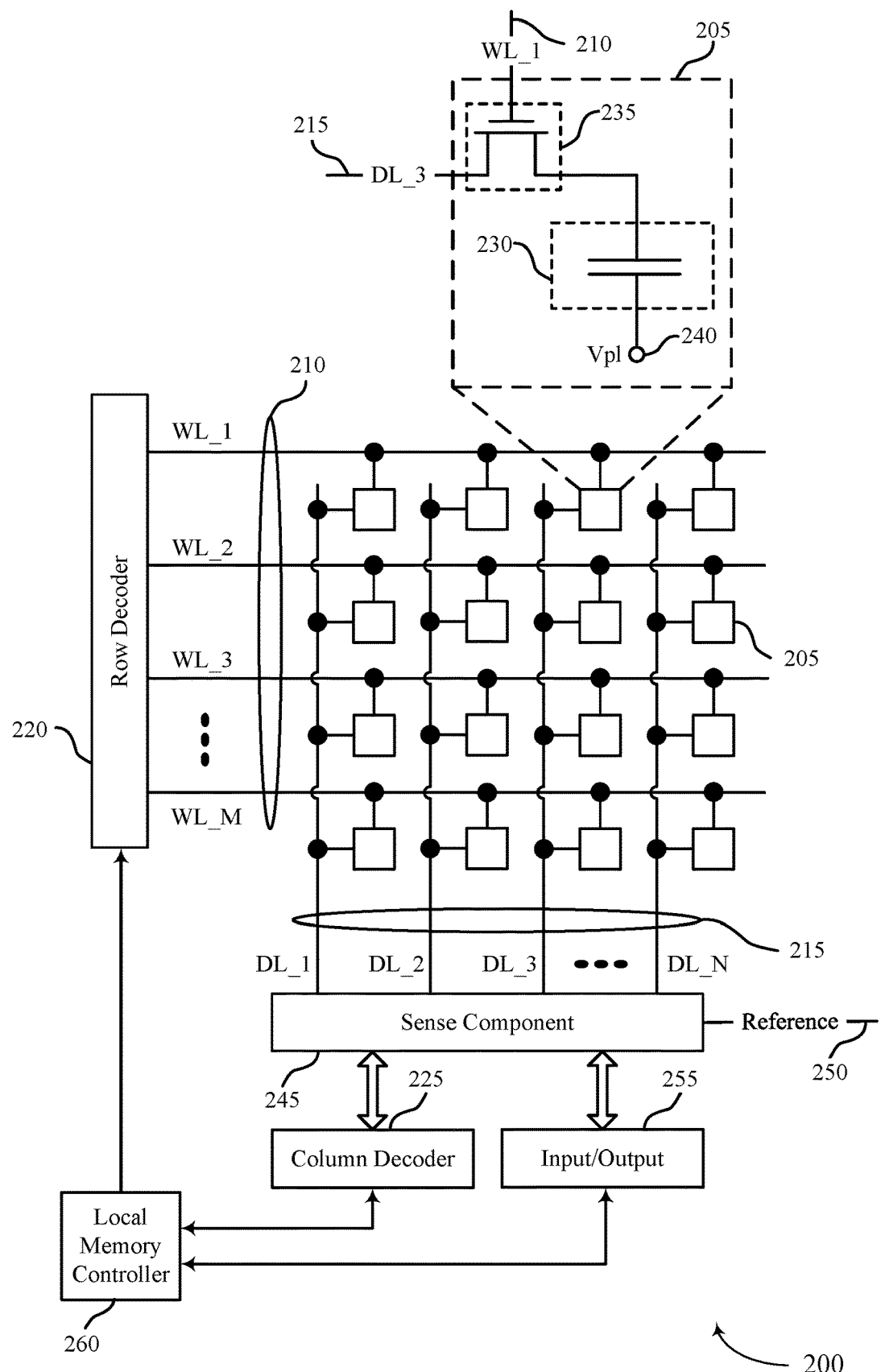
FIG. 2 illustrates an example of a memory device that supports adjusting a refresh rate during a self-refresh state in accordance with examples as disclosed herein.

FIG. 2 illustrates an example of a memory device 200 that supports adjusting a refresh rate during a self-refresh state in accordance with examples as disclosed herein. The memory device 200 may be an example of the memory devices 160 described with reference to FIG. 1. In some examples, the memory device 200 may be referred to as a memory chip, a memory die, or an electronic memory apparatus. The memory device 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory device 200 may include access lines (e.g., word lines 210, digit lines 215) arranged in a pattern, such as a grid-like pattern. An access line may be a conductive line coupled with a memory cell 205 and may be used to perform access operations on the memory cell 205. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The detected logic state of the memory cell 205 may be provided as an output of the sense component 245 (e.g., to an input/output 255), and may indicate the detected logic state to another component of a memory device (e.g., a memory system 110) that includes the memory device 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host system 105, another controller associated with the memory device 200), translate the commands or the data (or both) into information that can be used by the memory device 200, perform one or more operations on the memory device 200, and communicate data from the memory device 200 to a host (e.g., a host system 105) based on performing the one or more operations.

The local memory controller 260 may generate row signals and column address signals to activate the target word line 210 and the target digit line 215. The local memory controller 260 also may generate and control various signals (e.g., voltages, currents) used during the operation of the memory device 200. The local memory controller 260 may be operable to perform one or more access operations on one or more memory cells 205 of the memory device 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host system 105). The local memory controller 260 may be operable to perform other access operations not listed here or other operations related to the operating of the memory device 200 that are not directly related to accessing the memory cells 205.

The local memory controller 260 may be operable to perform a write operation (e.g., a programming operation)

on one or more memory cells 205 of the memory device 200. During a write operation, a memory cell 205 of the memory device 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory device 200. During a read operation, the state (e.g., logic state, charge state) stored in a memory cell 205 of the memory device 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

The local memory controller 260 may be operable to perform a refresh operation on one or more memory cells 205 of the memory device 200. During a refresh operation, the state (e.g., logic state, charge state) stored in a row of memory cells 205 of the memory device 200 may be evaluated. The local memory controller 260 may identify a target row (e.g., a target word line 210) based on a value of a counter (e.g., that is included in the local memory controller 260, that is coupled with the local memory controller 260) indicating the target row. Additionally, or alternatively, the local memory controller 260 may identify the target row based on receiving a command from another controller (e.g., a device memory controller as described with reference to FIG. 1). In either example, the local memory controller 260 may activate the target word line 210 to access the memory cells 205 corresponding to the target word line 210, the memory cells 205 may transfer signals to the sense component 245, and the sense component 245 may determine the logic states stored on the memory cells 205 corresponding to the target word line 210. Then, the local memory controller 260 may perform a write operation on the target word line 210 to write the data (e.g., the logic states stored on the memory cells 205 corresponding to the target word line 210 determined by the sense component 245 during the read operation) to the target word line 210. The local memory controller 260 may then activate the target word line 210 and apply signals to the digit lines 215 to store the data in the capacitors 230 of the memory cells 205 corresponding to the target word line 210. In some instances (e.g., in instances that the local memory controller 260 identifies the target word line 210 for the refresh operation based on a value of the counter), the local memory controller 260 may increment the value of the counter based on executing the refresh operation on the target word line 210.

In some cases, the memory device 200 may execute refresh operations on the word lines 210 while in a self-refresh state. Specifically, the memory device 200 may enter a self-refresh state and begin executing refresh operations at each row of memory cells 205 (e.g., corresponding to a word line 210) of the memory device 200 according to a first refresh rate (e.g., a relatively fast refresh rate). Once the local memory controller 260 determines that each row of memory cells 205 at the memory device 200 is refreshed according to the first refresh rate, the local memory controller 260 may decrease the refresh rate to a second, slower, refresh rate. In some cases, the local memory controller 260 may determine that each row of memory cells 205 at the memory device 200 is refreshed according to the first refresh rate using circuitry coupled with a counter, where a value of the counter indicates one of the rows of memory cells 205 and the local memory controller 260 executes refresh operations on the indicated row of memory cells 205. In some cases, the value of the counter may satisfy a threshold and the local memory controller 260 may reset the counter. The memory device 200 (or a memory system including the memory device 200) may include circuitry that outputs a signal indicating for the local memory controller 260 to decrease the refresh rate in response to detecting a second instance of resetting the counter while the memory device 200 is in the self-refresh state.

In some cases, outputting signaling indicating for the memory system to decrease the refresh rate after resetting the counter twice may ensure that each row of memory cells at the memory system is refreshed at least once prior to decreasing the refresh rate. Thus, the local memory controller 260 may refresh each row of memory cells 205 according to a relatively fast refresh rate, which may preserve a reliability of data stored in the rows of memory cells 205. Additionally, the local memory controller 260 may decrease a rate of executing refresh operations in the self-refresh state, which may decrease a power consumption of the memory device 200 while in the self-refresh state (e.g., as compared to a memory device 200 executing refresh operations in the self-refresh state according to a higher rate).

Figure 3:
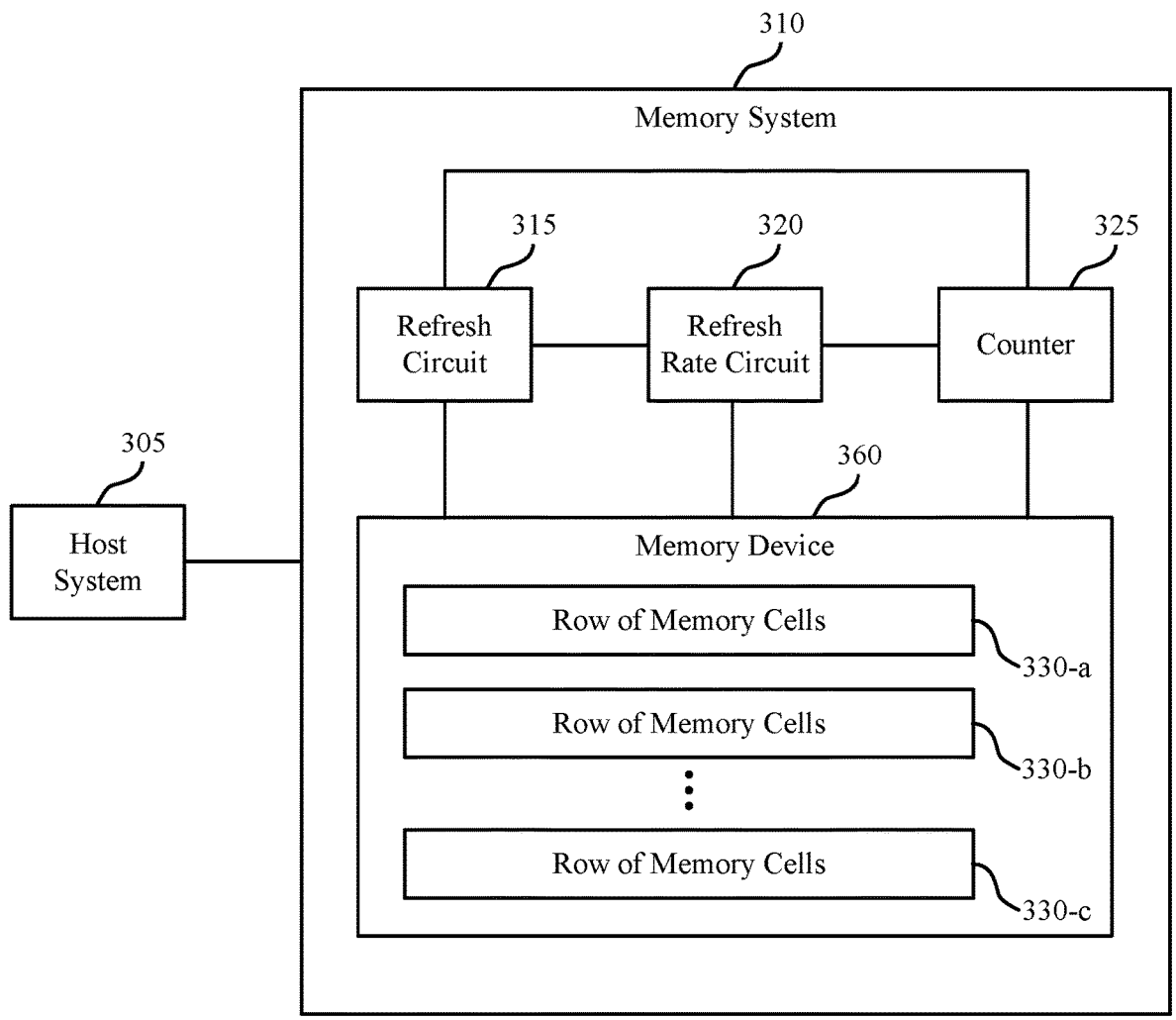
FIG. 3 illustrates an example of a system that supports adjusting a refresh rate during a self-refresh state in accordance with examples as disclosed herein.

FIG. 3 illustrates an example of a system 300 that supports adjusting a refresh rate during a self-refresh state in accordance with examples as disclosed herein. The system 300 may include aspects of the system and memory system as described with reference to FIGS. 1 and 2. For example, the host system 305, the memory system 310, and the memory device 360 may be examples of the host system, memory system, and memory systems as described with reference to FIGS. 1 and 2. The memory system 310 may additionally include a refresh circuit 315, a refresh rate circuit 320, and a counter 325. In some cases, one or more of the refresh circuit 315, the refresh rate circuit 320, and the counter 325 may be implemented by a controller (e.g., a device memory controller, a local memory controller) as described with reference to FIGS. 1 and 2. Additionally, or alternatively one or more of the refresh circuit 315, the refresh rate circuit 320, and the counter 325 may be implemented by circuitry that is distinct from a controller.

The memory system 310 may include one or more memory devices 360 (e.g., a memory array, a memory die). The memory device 360 may include a set of rows of memory cells 330, where each row of memory cells 330 is configured to store a set of data at the memory device 360. In some cases, the memory system 310 (e.g., via the refresh circuit 315) may execute a refresh operation on a row of memory cells 330. For example, the refresh circuit 315 may initiate a read operation at the row of memory cells 330 (e.g., to determine a set of data stored by the row of memory cells 330). Then, the refresh circuit 315 may initiate a write operation at the row of memory cells 330 (e.g., to store the set of data determined during the read operation at the row of memory cells).

In some instances, the refresh circuit 315 may execute refresh operations on the rows of memory cells 330 in response to a command received from the host system 305. That is, the host system 305 may transmit one or more commands indicating for the memory system 310 to execute one or more refresh operations. In some examples, the memory system 310 executing refresh operations in response to commands from the host system 305 may correspond to the memory system 310 operating in an automatic refresh state. Here, the automatic refresh state of the memory system 310 may correspond to a refresh rate (e.g., a preconfigured refresh rate, a predefined refresh rate, a refresh rate indicated by the host system 305).

In addition to executing refresh operations in response to receiving a command from the host system 305, the memory system 310 may execute refresh operations in response to internally-generated refresh commands. For example, the memory system 310 may enter a self-refresh state where the memory system 310 generates refresh commands and executes refresh operations without receiving commands from the host system 305. In some cases, the memory system 310 may enter the self-refresh state in response to receiving a command from the host system 305. Additionally, or alternatively, the memory system 310 may enter the self-refresh state based on an internally-generated command to enter the self-refresh state (e.g., from an automatic refresh state). In the self-refresh state, the refresh circuit 315 may generate a refresh command to execute a refresh operation on one of the rows of memory cells 330.

The refresh circuit 315 may execute refresh operations on rows of memory cells 330 at the memory system 310 based on values of the counter 325. For example, the refresh circuit 315 may detect the value of the counter 325 and identify one of the rows of memory cells 330 indicated by the value of the counter 325. In some cases, the value of the counter 325 may correspond to an index of a row of memory cells 330 at the memory system 310. Then, the refresh circuit 315 may execute a refresh operation at the indicated row of memory cells 330, increment the counter 325, and execute a next refresh operation on a next row of memory cells 330 (e.g., based on the incremented value of the counter 325 indicating the next row of memory cells 330). For example, in a case that a first value of the counter 325 indicates the row of memory cells 330-a, the refresh circuit 315 may execute a refresh operation on the row of memory cells 330-a, increment the counter 325 (e.g., output signaling to the counter 325 indicating that a refresh operation occurred at the memory system 310 which may cause the counter 325 to increment the value of the counter 325), and execute another refresh operation on the row of memory cells 330-b indicated by the incremented value of the counter 325.

In cases that the value of the counter 325 indicates a last row of memory cells 330-c storing data at the memory system 310 (e.g., a row of memory cells 330-a associated with a larger value than other rows of memory cells 330 at the memory system 310), the counter 325 may roll over or reset a value of the counter 325. In some cases, the memory system 310 may reset the value of the counter 325 in response to determining that the counter 325 is in an overflow condition (e.g., a value of the counter 325 satisfies a threshold). That is, the counter 325 may be associated with a threshold value (e.g., a maximum value). In cases that the value of the counter 325 satisfies the threshold, the memory system 310 may reset the value of the counter 325. In some cases, the threshold may correspond to a maximum quantity of rows of memory cells 330 associated with the memory system 310. After resetting the counter 325, the value of the counter 325 may indicate a first row of memory cells 330-a at the memory system 310 (e.g., a row of memory cells 330-a associated with a smaller value than other rows of memory cells 330 at the memory system 310).

The refresh circuit 315 may initiate refresh operations on the rows of memory cells 330 (e.g., by generated refresh commands and executing the commands on a corresponding row of memory cells 330) according to a refresh rate. In some cases, the refresh rate may correspond to a periodicity, rate, time period, or frequency for executing a refresh operation on one of the rows of memory cells 330. Additionally, or alternatively, the rate may indicate a periodicity, rate, time period, or frequency for refreshing each of the rows of memory cells 330 at the memory system 310. The refresh rate for executing refresh operations during the self-refresh state may be indicated to the refresh circuit 315 by the refresh rate circuit 320. For example, the refresh rate circuit 320 may communicate signaling, to the refresh circuit 315, indicating the refresh rate for executing refresh operations during the self-refresh state.

A refresh rate may impact the performance of the memory system. If the refresh rate is relatively fast, the memory system may use more power as it is frequently refreshing the state stored by memory cells. If the refresh is relatively slow, the memory system may experience additional errors because the state stored on the memory cells may deteriorate before the refresh operation is performed. In some cases, it may be useful to have a configurable refresh rate to mitigate the potential for errors in the data and to conserve power.

In some cases, the refresh rate circuit 320 may indicate, to the refresh circuit 315, one of two or more possible refresh rates for executing refresh operations in the self-refresh state. For example, the refresh rate circuit 320 may output a signal corresponding to a low voltage state indicating the first refresh rate and may output a signal corresponding to a high voltage state indicating the second refresh rate. Here, the two possible refresh rates may be preconfigured or predefined (e.g., during a manufacturing of the memory system 310, by the host system 305). Additionally, or alternatively, the refresh rate circuit 320 may indicate, to the refresh circuit 315, a refresh rate from more than two possible refresh rates for executing refresh operations in the self-refresh state. For example, the memory system 310 may be configured with a set of possible refresh rates (e.g., during a manufacturing of the memory system 310, by the host system 305). Then, the refresh rate circuit 320 may indicate one of the set of possible refresh rates to the refresh circuit 315 for executing refresh operations.

When the memory system 310 enters the self-refresh state, the memory system 310 may initially execute refresh operations according to a first, higher rate. For example, the refresh circuit 315 may execute a first set of refresh operations on the rows of memory cells 330 according to the first, higher rate. In this example, the refresh rate circuit 320 may output signaling to the refresh circuit 315 indicating for the refresh circuit 315 to execute refresh operations on the rows of memory cells 330 according to the first, higher rate. In some cases, the first, higher rate of executing refresh operations during the self-refresh state may be a same rate of executing refresh operations in response to refresh commands received from the host system (e.g., when the memory system 310 is in an automatic refresh state). For example, the memory system 310 may execute the first set of refresh operations to refresh each of the rows of memory cells 330 at the memory system 310 within 64 milliseconds (ms).

In some cases, the memory system 310 may decrease the rate of executing refresh operations while in the self-refresh state after executing a refresh operation on each of the rows of memory cells 330 at the memory system 310. For example, the refresh rate circuit 320 may determine whether each of the rows of memory cells 330 have been refreshed according to the first, higher refresh rate. In cases that each of the rows of memory cells 330 have not been refreshed according to the first, higher refresh rate since the memory system 310 entered the self-refresh state, the refresh rate circuit 320 may output signaling to the refresh circuit 315 indicating for the refresh circuit 315 to execute the refresh operations on the rows of memory cells 330 according to the first, higher refresh rate. Additionally, in cases that each of the rows of memory cells 330 have been refreshed according to the first, higher refresh rate since the memory system 310 entered the self-refresh state, the refresh rate circuit 320 may output signaling to the refresh circuit 315 indicating for the refresh circuit 315 to execute the refresh operations on the rows of memory cells 330 according to a second, slower refresh rate.

In some cases, when executing refresh operations in the self-refresh state according to the second, slower refresh rate, the memory system 310 may execute a second set of refresh operations to refresh each of the rows of memory cells 330 at the memory system 310 within a larger time interval (e.g., 5 ms, 2 seconds). Additionally, or alternatively, the refresh rate circuit 320 may select the second, slower refresh rate based on a temperature of the memory system 310. For example, in cases that a temperature of the memory system 310 is relatively low, the refresh rate circuit 320 may select a relatively slow second refresh rate (e.g., refreshing each of the rows of memory cells 330 within 2 seconds). In another example, in cases that a temperature of the memory system 310 is relatively high, the refresh rate circuit 320 may select a relatively fast second refresh rate (e.g., refreshing each of the rows of memory cells 330 within 5 ms).

The refresh rate circuit 320 may include circuitry configured to determine whether each of the rows of memory cells 330 have been refreshed according to the first, higher refresh rate since the memory system 310 entered the self-refresh state. In one example, the refresh rate circuit 320 may determine whether each of the rows of memory cells 330 have been refreshed based on comparing a value of the counter 325 when the memory system 310 initially entered the self-refresh state and a value of the counter 325 after executing each of the refresh operations while in the self-refresh state. Here, the refresh rate circuit 320 may determine that each of the rows of memory cells 330 have been refreshed when the value of the counter 325 when the memory system 310 initially entered the self-refresh state and the value of the counter 325 after executing a set of refresh operations are the same. That is, the value of the counter 325 may be the same as an initial value of the counter 325 when the counter 325 indicates for a row of memory cells 330 to be refreshed for a second time after entering the self-refresh mode.

In another example, the refresh rate circuit 320 may determine whether each of the rows of memory cells 330 have been refreshed based on comparing an initial address associated with a first row of memory cells 330 refreshed when the memory system 310 entered the self-refresh rate with an address of a row of memory cells 330 currently being refreshed by the memory system 310. For example, the refresh rate circuit 320 may include one or more latches configured to store a row address corresponding to the row of memory cells 330 initially refreshed when the memory system 310 entered the self-refresh state. Additionally, the refresh rate circuit 320 may include an address comparator circuit configured to compare the row address stored by the one or more latches with a row address associated with a row of memory cells 330 currently being refreshed by the memory system 310. Here, the refresh rate circuit 320 may determine that each of the rows of memory cells 330 have been refreshed when the row address corresponding to the row of memory cells 330 currently being refreshed is the same as the row address stored in the one or more latches at the refresh rate circuit 320. That is, the row address corresponding to the row of memory cells 330 currently being refreshed may be the same as the initial row of memory cells 330 being refreshed when the memory system 310 entered the self-refresh state when the each of the rows of memory cells 330 has been refreshed once since the memory system 310 entered the self-refresh state.

In another example, the refresh rate circuit 320 may determine whether each of the rows of memory cells 330 have been refreshed based on initiating a counter at the refresh rate circuit 320 upon entering the self-refresh state. Here, the refresh rate circuit 320 may include a counter and when the memory system 310 enters the self-refresh state, the refresh rate circuit 320 may reset the counter (e.g., initialize the value of the counter to '0') at the refresh rate circuit 320. Then, the refresh rate circuit 320 may increment the value of the counter at the refresh rate circuit 320 in response to the refresh circuit 315 executing each of the refresh operations while in the self-refresh state. In one example, the refresh rate circuit 320 may compare the value of the counter at the refresh rate circuit 320 to a threshold that is based at least in part on a quantity of rows of memory cells 330 at the memory system 310. For example, the threshold may be equal to or greater than the quantity of rows of memory cells 330 at the memory system 310. When the refresh rate circuit 320 determines that the counter at the refresh rate circuit 320 exceeds the threshold, the refresh rate circuit 320 may determine that each of the rows of memory cells 330 have been refreshed at least once while the memory system 310 is in the self-refresh state. In another example, the counter may be associated with a threshold value (e.g., a maximum value). In cases that the value of the counter satisfies the threshold, the memory system 310 may detect an overflow condition of the counter and reset the value of the counter. Here, the refresh rate circuit 320 may determine that each of the rows of memory cells 330 have been refreshed at least once while the memory system 310 is in the self-refresh state based on detecting the overflow condition of the counter.

In another example, the refresh rate circuit 320 may determine whether each of the rows of memory cells 330 have been refreshed based on whether or not a value of the counter 325 has satisfied a threshold twice since the memory system 310 enters a self-refresh state. That is, the refresh rate circuit 320 may detect each instance of a value of the counter 325 satisfying the threshold (e.g., and subsequently resetting or rolling over the counter 325). In response to determining that the value of the counter 325 satisfies the threshold a second time while the memory system 310 is in the self-refresh state, the refresh rate circuit may determine that each of the rows of memory cells 330 has been refreshed at least one time while the memory system 310 is in the self-refresh state. That is, when the memory system 310 enters the self-refresh state, the counter 325 may indicate a row of memory cells 330 based on a previously-executed refresh operation and therefore may not indicate a first row of memory cells 330-a when the memory system 310 initially enters the self-refresh state. As such, when a value of the counter 325 satisfies the threshold (e.g., and refreshes or rolls over to an initial value), there may be remaining rows of memory cells 330 that the refresh circuit 315 has not refreshed according to the first, higher refresh rate while in the self-refresh state. Therefore, the refresh rate circuit 320 signaling to the refresh circuit 315 to decrease the refresh rate in response to determining that the value of the counter 325 has satisfied a threshold for a second time since the memory system 310 enters the self-refresh state may ensure that each of the rows of memory cells 330 is refreshed at least once according to the first, higher refresh rate.

In response to receiving signaling from the refresh rate circuit 320 indicating to decrease the rate of executing refresh operations in the self-refresh state, the refresh circuit 315 may execute refresh operations on the rows of memory cells 330 according to the second, slower refresh rate. The refresh circuit 315 may continue executing refresh operations on the rows of memory cells 330 according to the second, slower refresh rate until the memory system 310 exits the self-refresh state. In some cases, the memory system 310 may exit the self-refresh state prior to the refresh rate circuit 320 indicating to decrease the rate of executing refresh operations. For example, the memory system 310 may exit the self-refresh state prior to the refresh rate circuit 320 determining that each of the rows of memory cells 330 have been refreshed according to the first, higher refresh rate. Here, the memory system 310 may exit the self-refresh state without the refresh circuit 315 switching from the first, faster refresh rate to the second, slower refresh rate.

Figure 4:
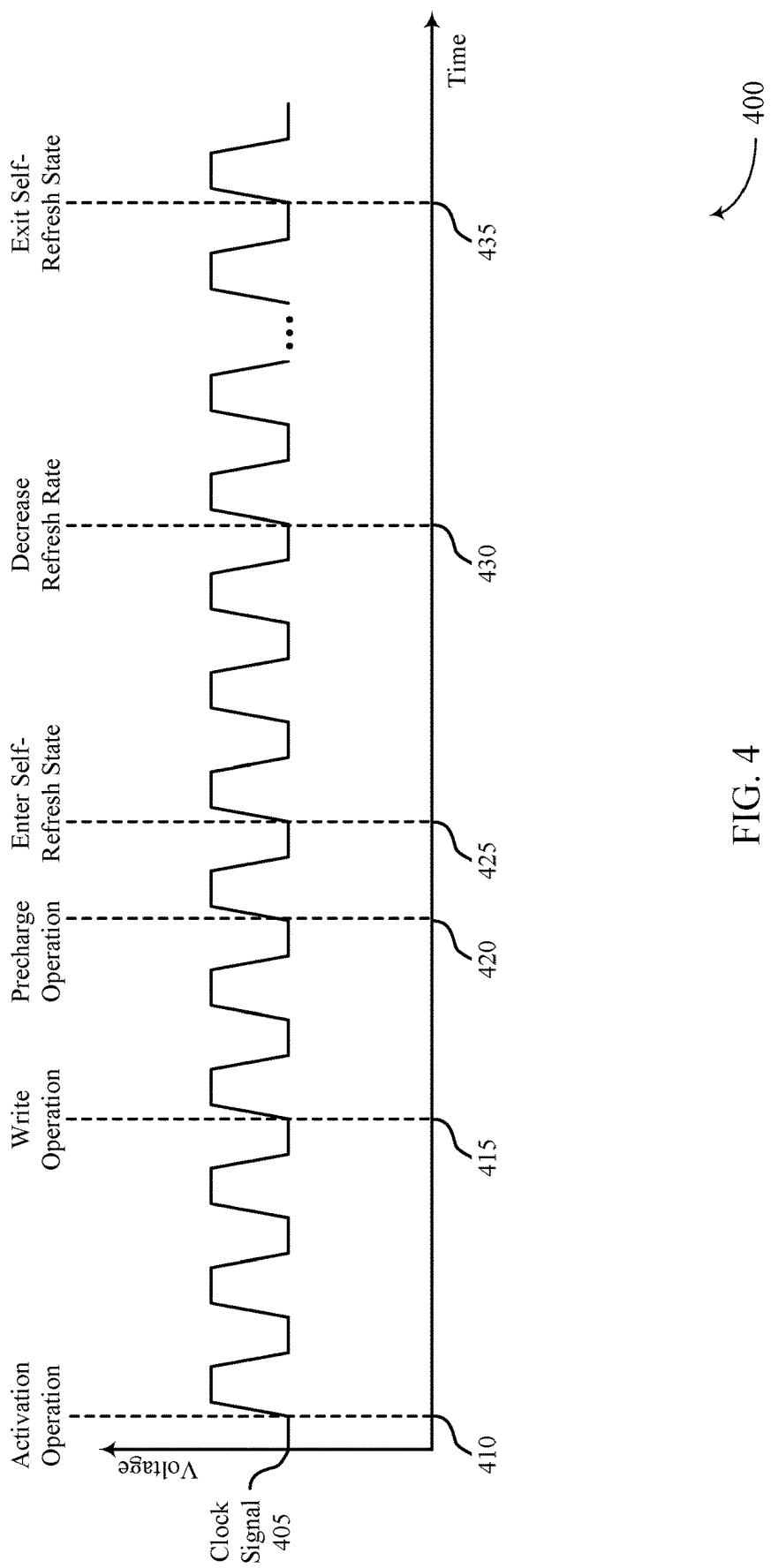
FIG. 4 illustrates an example of a timing diagram that supports adjusting a refresh rate during a self-refresh state in accordance with examples as disclosed herein.

FIG. 4 illustrates an example of a timing diagram 400 that supports adjusting a refresh rate during a self-refresh state in accordance with examples as disclosed herein. The timing diagram 400 may include aspects of the systems and memory devices as described with reference to FIGS. 1 through 3. For example, a memory system (or in some cases, a memory device or a memory die) may implement the timing diagram 400 when entering and exiting a self-refresh state. In the example of the timing diagram 400, the memory system may initially be in an automatic refresh state, may enter into a self-refresh state (e.g., at 425), and may exit the self-refresh state (e.g., at 435). The timing diagram 400 may illustrate an example set of operations performed by the memory system with respect to a clock signal 405 of the memory system or memory device.

At 410, the memory system may perform an activation operation to activate one or more rows of memory cells at the memory system. For example, the memory system may apply a voltage to one or more access lines of the memory system (e.g., to access the corresponding rows of memory cells at the memory system). At 415, the memory system may perform a write operation on the one or more rows of memory cells (e.g., activated at 410). In some cases, the memory system may perform the activate and write operations at 410 and 415, respectively, in response to a command received from a host system. Additionally, or alternatively, the memory system may perform the activate and write operations at 410 and 415, respectively, in response to an internally-generated command (e.g., by a controller at the memory system). At 420, the memory system may perform a precharge operation on the one or more rows of memory cells at the memory system. Here, the memory system may release data from a buffer (e.g., a write buffer) and deactivate the one or more rows of memory cells at the memory system (e.g., based on executing the write operation on the one or more rows of memory cells at the memory system at 410).

In some cases, a reliability of the data stored in the one or more rows of memory cells during an execution of the write operation at 415 may be based on a time between 415 (e.g., executing the write operation) and 420 (e.g., executing the precharge operation). In some cases, a longer duration between the write operation at 415 and the precharge operation at 420 may improve a reliability of data stored during the write operation at 415. Additionally, in cases that the time between 415 and 420 is shorter, the reliability of the data stored during the write operation at 415 may lessen. Here, executing a refresh operation on the one or more rows of memory cells (e.g., that were written to during the write operation at 415) may increase the reliability of those one or more rows of memory cells.

At 425, the memory system may enter the self-refresh state. For example, prior to 425 the memory system may execute refresh operations on rows of memory cells at the memory system in response to receiving commands (e.g., from a host system). At 425, the memory system may enter the self-refresh state and begin executing refresh operations in response to internally-generated commands. Additionally, or alternatively, the memory system may decrease a power supply to one or more components of the memory system upon entering the self-refresh state. Thus, entering the self-refresh state may correspond to a decrease in power consumption of the memory system as compared to a power consumption prior to entering the self-refresh state at 425.

The memory system may initially execute refresh operations according to a first, higher rate upon entering the self-refresh state at 425. In some cases, the memory system may execute the refresh operations at a same rate of executing refresh operations in response to refresh commands received from the host system (e.g., prior to the memory system entering the self-refresh state at 425). For example, the memory system may begin executing refresh operations at 425 to refresh each of the rows of memory cells at the memory system within 64 ms. In some cases, executing a refresh operation on each row of memory cells at the memory system may improve a reliability of data stored by the rows of memory cells. For example, one or more rows of memory cells may be associated with a decreased reliability prior to executing the refresh operation on the rows of memory cells (e.g., due to being written to at 415 in cases where a time between the write operation at 415 and the precharge operation at 420 is relatively short). Here, executing the refresh operations on those rows of memory cells may improve a reliability of the data stored by the rows of memory cells.

At 430, the memory system may decrease the refresh rate from the first, faster refresh rate to a second, slower refresh rate. That is, at 430 the memory system may decrease the rate of executing refresh operations while in the self-refresh state after executing refresh operations on each of the rows of memory cells at the memory system according to the first, faster refresh rate. For example, at 430 the memory system may determine that each of the rows of memory cells at the memory system has been refreshed according to the first, faster refresh rate since entering the self-refresh state at 425. In some cases, the memory system may determine that each of the rows of memory cells has been refreshed according to the first, faster refresh rate based on determining that a value of a counter at the memory system (e.g., indicating a row of memory cells for executing a refresh operation) has satisfied a threshold value two times since the memory system enters the self-refresh state at 425. A refresh rate circuit may then decrease the refresh rate to the second, slower refresh rate in response to the determination. In some cases, executing refresh operations according to the first, higher refresh rate prior to decreasing a refresh rate may improve a reliability of the rows of memory cells at the memory system (e.g., as compared to entering the self-refresh state and initially executing refresh operations according to the second, slower refresh rate).

In the example of the timing diagram 400, the memory system determines that each of the rows of memory cells have been refreshed according to the first, higher refresh rate while in the self-refresh state. In some other examples, a memory system may not determine that each of the rows of memory cells have been refreshed according to the first, higher refresh rate prior to exiting the self-refresh state. Here, the memory system may not decrease the rate for executing refresh operations while in the self-refresh state (e.g., may refrain from decreasing the rate for executing the refresh operations based on determining that each of the rows of memory cells have not been refreshed according to the first, higher refresh rate) and may exit the self-refresh state prior to decreasing the refresh rate.

In some cases, when executing refresh operations in the self-refresh state according to the second, slower refresh rate (e.g., after 430), the memory system may execute refresh operations to refresh each of the rows of memory cells at the memory system within a larger time (e.g., as compared to a time associated with refreshing each of the rows of memory cells at the memory system according to the first, faster refresh rate).

At 435, the memory system may exit the self-refresh state (e.g., and enter an automatic refresh state). That is, at 435 the memory system may stop generating commands to refresh rows of memory cells at the memory system and may begin executing refresh operations in response to commands received from a host system. As part of exiting the self-refresh state, the memory system may disable or reset circuits of the self-refresh state (e.g., circuits related to the refresh rate circuit and refresh circuit).

Figure 5:
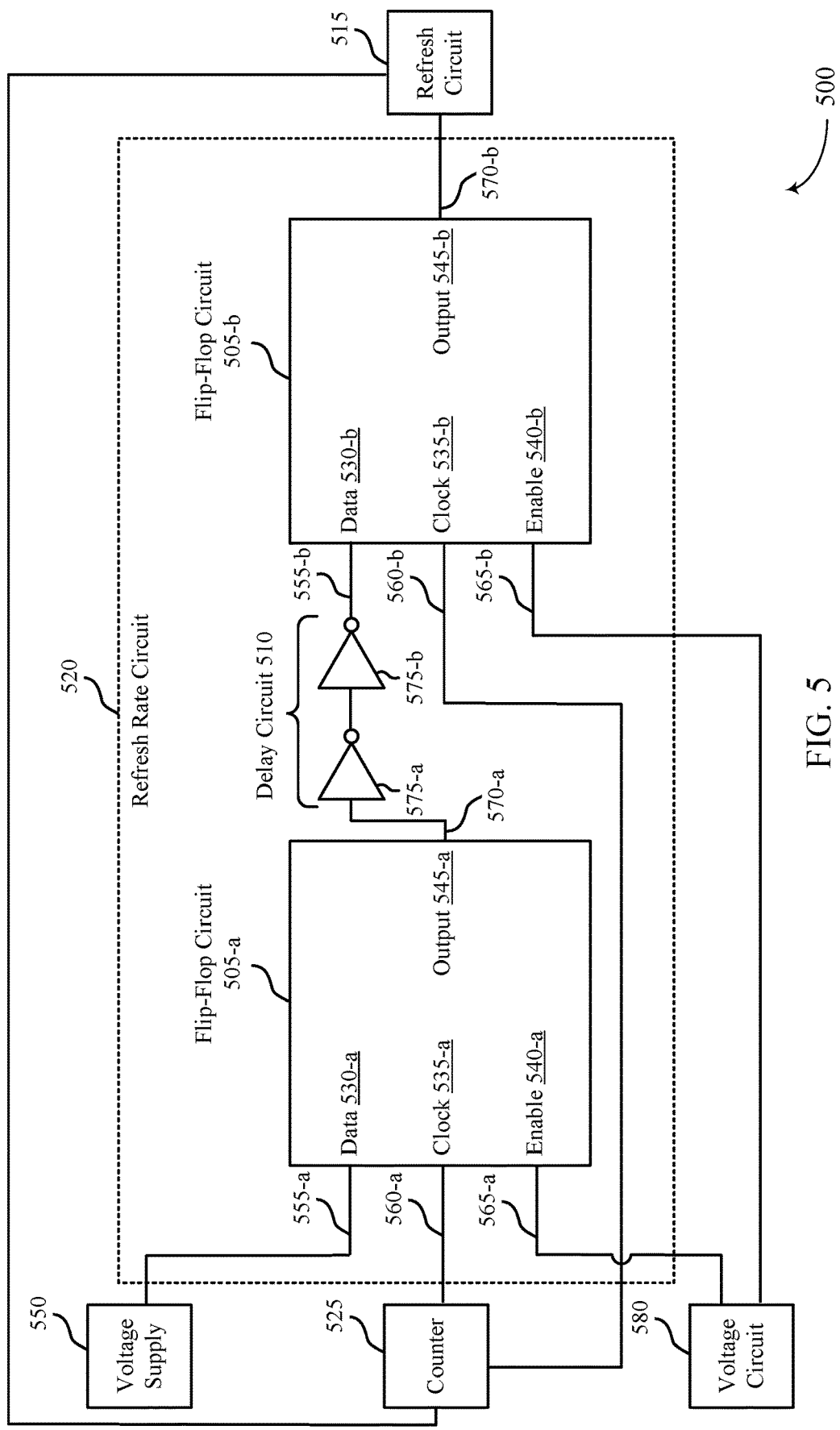
FIG. 5 illustrates an example of circuitry that supports adjusting a refresh rate during a self-refresh state in accordance with examples as disclosed herein.

FIG. 5 illustrates an example of a circuitry 500 that supports adjusting a refresh rate during a self-refresh state in accordance with examples as disclosed herein. The circuitry 500 may include aspects of the memory system as described with reference to FIGS. 1 through 4. For example, the refresh rate circuit 520, the refresh circuit 515, and the counter 525 may be examples of the refresh rate circuit 320, the refresh circuit 315, and the counter 325, respectively, as described with reference to FIG. 3. In some cases, the refresh rate circuit 520, the refresh circuit 515, and the counter 525 may be implemented by a controller (e.g., a device memory controller, a local memory controller) as described with reference to FIGS. 1 and 2. Additionally, or alternatively, one or more of the refresh circuit 515, the refresh rate circuit 520, and the counter 525 may be implemented by circuitry that is distinct from a controller.

The refresh rate circuit 520 may include two flip-flop circuits 505 that each include data inputs 530, clock inputs 535, enable inputs 540, and outputs 545. In some cases, the flip-flop circuits 505 may be examples of D flip-flop with enable circuits. For example, the flip-flop circuits 505 may be disabled (e.g., the flip-flop circuits 505 may reset values of the signals 570 output from the flip-flop circuits 505 and may not propagate signals from the data inputs 530 to the outputs 545) when the signal 565 applied to the enable inputs 540 is a first value. Additionally, the flip-flop circuits 505 may be enabled when the signal 565 applied to the enable inputs 540 is a second value (e.g., different from the first value). Additionally, the flip-flop circuits 505 may be gated. That is, the flip-flop circuits 505 may refrain from propagating signals 555 from the data inputs 530 to the outputs 545 based on the signals 560 applied to the clock inputs 535. For example, the flip-flop circuits 505 may propagate signals 555 from the data inputs 530 to the outputs 545 synchronously (e.g., in response to a rising edge of the signal 560 applied to the clock inputs 535, in response to the signal 560 being a value such as a high voltage or a low voltage). Thus, the flip-flop circuits 505 may refrain from propagating signals 555 from the data inputs 530 to the outputs 545 unless a signal 565 applied to the enable input 540 enables the flip-flop circuits 505 and a condition of the signal 560 applied to the clock input 535 is satisfied).

Two flip-flop circuits 505 may be used to adjust refresh rates to ensure that every memory cell gets refreshed at least once before slowing down the refresh rate. When a memory system first enters a self-refresh mode, there are possible scenarios where errors may develop in stored data if the memory cell storing the data are not refreshed relatively quickly. The combination of both flip-flop circuits may ensure that memory cells get refreshed at least once before the refresh rate is reduced (e.g., to conserve power).

The enable inputs 540 of the flip-flop circuits 505 may be coupled with the voltage circuit 580. In some cases, the voltage circuit 580 may include a voltage supply and a switching component. Additionally, or alternatively, the voltage circuit 580 may by implemented by a controller of the memory system. In some cases, the voltage circuit 580 may apply a signal 565 to the enable inputs 540 of the flip-flop circuits to enable the flip-flop circuits 505 in response to the memory system entering a self-refresh state. For example, in response to entering the self-refresh state, the voltage circuit 580 may adjust a value of the signals 565 (e.g., from a first value to a second value) to enable the flip-flop circuits 505. Additionally, in response to the memory system exiting the self-refresh state, the voltage circuit 580 may adjust the value of the signals 565 (e.g., from the second value to the first value) to disable the flip-flop circuits 505. In some cases, upon being disabled, the flip-flop circuits 505 may reset values of the signals 570 to a preconfigured value.

The data input 530-*a* of the flip-flop circuit 505-*a* may be coupled with a voltage supply 550. As such, the signal 555 applied to the data input 530-*a* of the flip-flop circuit 505-*a* may be a constant value (e.g., corresponding to the voltage supplied by the voltage supply 550, VDD). Additionally, the data input 530-*b* of the flip-flop circuit 505-*b* may be coupled with the output 545 of the flip-flop circuit 505-*a* via the delay circuit 510. The delay circuit 510 may delay changes in a value of the signal 570-*a* from propagating to the data input 530-*b*. In one example, the delay circuit 510 may include a first inverter 575-*a* and a second inverter 575-*b*. The first inverter 575-*a* may invert a value of the signal 570-*a* and the second inverter 575-*b* may perform a second inversion that reverts the value to the signal 570-*a*. Thus, a value of the signal 555-*b* applied to the data input 530-*b* of the flip-flop circuit 505-*b* may be a same value as the signal 570-*a* (e.g., after the delay). The clock inputs 535 of the flip-flop circuits 505 may be coupled with the counter 525 (or, in some cases, with circuitry that output the signals 560 based on a value of the counter 525). In some cases, the counter 525 may indicate a row of memory cells for the refresh circuit 515 to refresh. When a value of the counter 525 satisfies a threshold, the counter 525 may adjust a value of the signals 560 applied to the clock inputs 535 of the flip-flop circuits 505 (e.g., from a first value to a second value). Additionally, in cases that the value of the counter 525 fails to satisfy the threshold, the counter 525 may adjust the value of the signals 560 from the second value to the first value. Thus, the signal 560 may be a first value in cases that the value of the counter 525 does not satisfy the threshold and may be a second value in cases that the value of the counter 525 does satisfy the threshold.

The signal 570-*b* propagated from the output 545-*b* of the flip-flop circuit 505-*b* may indicate a refresh rate to the refresh circuit 515. For example, when the memory system initially enters a self-refresh state, the signal 570-*b* may be a first value indicating for the refresh circuit 515 to execute refresh operations according to a first, faster refresh rate. Additionally, when the signal 570-*b* is changed from the first value to a second value, the signal 570-*b* may indicate, to the refresh circuit 515, to execute refresh operations according to a second, slower refresh rate.

When a value of the counter 525 satisfies the threshold for a first time since the memory system enters the self-refresh state, the signal 560 applied to the clock inputs 535 may be adjusted (e.g., from a first value to a second value). In some cases, the signal 560-*a* changing from the first value to the second value may cause the flip-flop circuit 505-*a* to propagate the signal 555-*a* (e.g., the VDD applied to the data input 530-*a* by the voltage supply 550) to the output 545-*a*. Thus, the signal 570-*a* may change from a first value to a second value (e.g., to the voltage VDD) in response to the value of the counter 525 satisfying the threshold for the first time. In some cases, when the signal 560-*b* applied to the clock input 535-*b* is adjusted in response to the value of the counter 525 for the first time since entering the self-refresh state, the value of the signal 555-*b* may be set to an initial value, which may the same as the value of the signal 570-*b* output from the flip-flop circuit 505-*b*. Thus, the flip-flop circuit 505-*b* may not adjust the signal 570-*b* of the output 545-*b* of the flip-flop circuit 505-*b* in response to the counter 525 satisfying the threshold for the first time.

The memory system may reset the counter 525 (e.g., may roll over the counter 525) after the value of the counter 525 satisfies the threshold. For example, the refresh circuit 515 may execute a refresh operation at a row indicated by the value of the counter 525 that satisfies the threshold. Then the counter may reset the value of the counter 525 to an initial value. In response to resetting the value of the counter 525 (e.g., rolling over the counter 525), the signal 560 applied to the clock inputs 535 may be adjusted (e.g., from the second value to the first value). In some cases, the delay circuit 510 may delay the change of the signal 570-*a* to the signal 555-*b* applied to the data input 530-*b* of the flip-flop circuit 505-*b* until after the signal 560 applied to the clock inputs 535 is adjusted (e.g., to the first value in response to resetting the counter 525). Thus, the flip-flop circuit 505-*b* may refrain from propagating the signal 555-*b* from the data input 530-*b* to the output 545-*b* based on the signal 560-*b* being the first value (e.g., until the signal 560-*b* changes from the first value to the second value again).

When the value of the counter 525 satisfies the threshold for a second time after the memory system enters the self-refresh state, the signal 560 applied to the clock inputs 535 may be adjusted (e.g., from the first value to the second value). When the clock input 535-*b* changes, the flip-flop circuit 505-*b* may propagate the signal 555-*b* applied to the data input 530-*b* to the output 545-*b*. Thus, the value of the signal 570-*b* may be adjusted from a first value to a second value (e.g., indicating for the refresh circuit 515 to decrease a rate for executing refresh operations). In some cases, the refresh circuit 515 may decrease the refresh rate by skipping instances of self-refresh, thus extending the time between refreshing rows of the memory array. In other cases, the refresh circuit 515 may decrease the refresh rate by extending the oscillator time.

Figure 6:
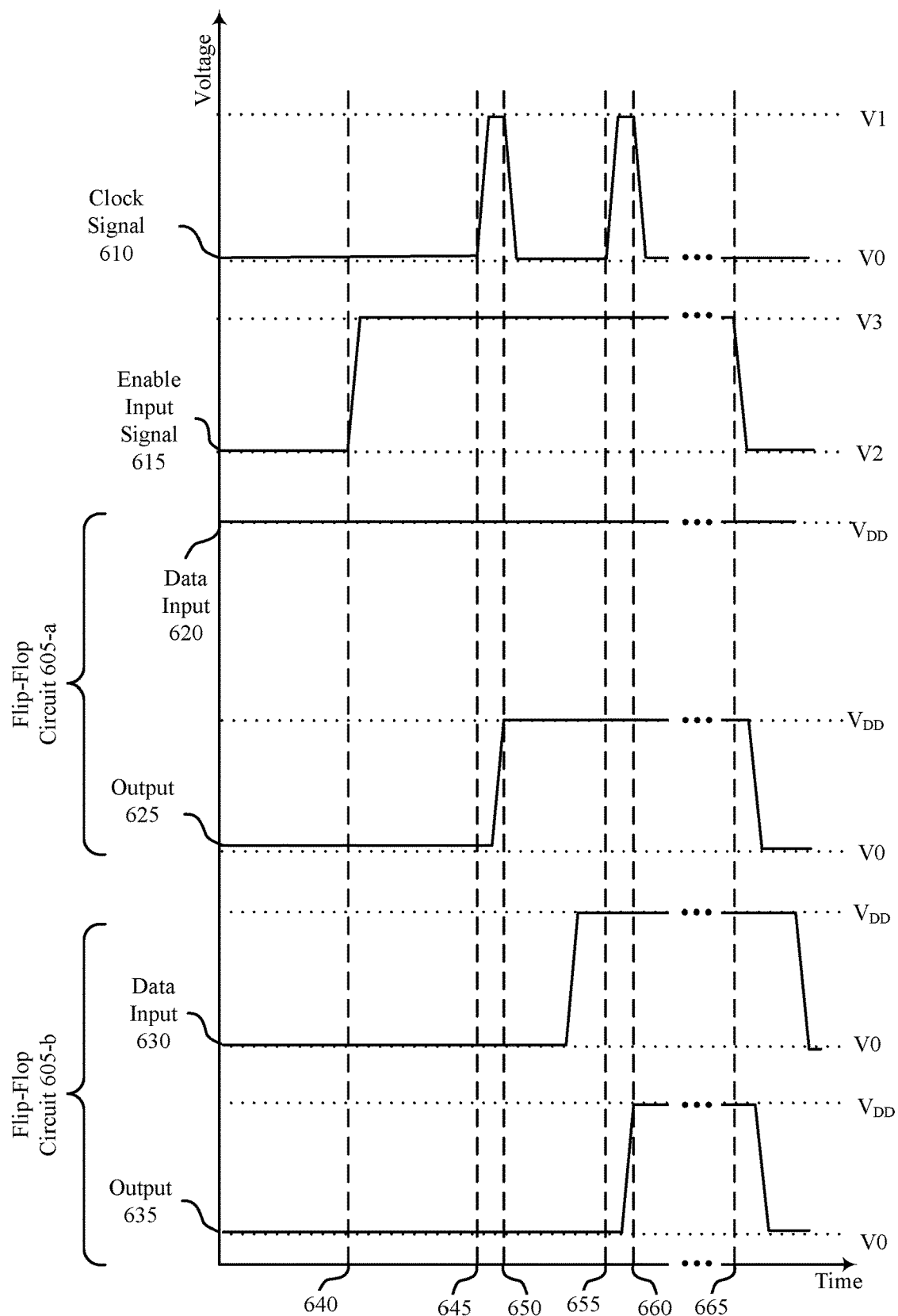
FIG. 6 illustrates an example of a timing diagram that supports adjusting a refresh rate during a self-refresh state in accordance with examples as disclosed herein.

FIG. 6 illustrates an example of a timing diagram 600 for the circuitry 500 that supports adjusting a refresh rate during a self-refresh state in accordance with examples as disclosed herein. The timing diagram 600 may include aspects of the memory system as described with reference to FIGS. 1 through 5. For example, the clock signal 610 and the enable input signal 615 may be examples of the signals 560 applied to the clock inputs of the flip-flop circuits and the signals 565 applied to the enable inputs of the flip-flop circuits, respectively, as described with reference to FIG. 5. Additionally, the flip-flop circuits 605-*a* and 605-*b* may be examples of the flip-flop circuits 505-*a* and 505-*b*, respectively, as described with reference to FIG. 5. The data input 620 may be an example of the signal 555-*a* applied to the data input of the flip-flop circuit 505-*a*, the output 625 may be an example of the signal 570-*a* output from the flip-flop circuit 505-*a*, the data input 630 may be an example of the signal 555-*b* applied to the data input of the flip-flop circuit 505-*b*, and the output 635 may be an example of the signal 570-*b* output from the flip-flop circuit 505-*b* as described with reference to FIG. 5.

The data input 620 may be coupled with the voltage supply 550, which may produce a voltage VDD. Additionally, the output 625, the data input 630, and the output 635 may be initialized to a preconfigured voltage (e.g., V0). In some cases, there may be a slight time delay between the signal transition from a first voltage to a second voltage, therefore the signal transitions shown in FIG. 6 may not be instantaneous.

At time 640, the memory system may enter the self-refresh state and accordingly the enable input signal 615 may change from a first voltage V2 to a second voltage V3. In some cases, the enable input signal 615 changing to the voltage V3 may enable the flip-flop circuits 605 (e.g., to propagate signals from the data inputs to the outputs of the flip-flop circuits 605).

At time 645, the clock signal 610 may transition from a first voltage V0 to a second voltage V1 in response to the counter 525 satisfying a threshold for a first time since the memory system enters the self-refresh state at time 640. For example, the memory system may determine that the counter 525 is in an overflow condition. Additionally, or alternatively, the memory system may determine that a value of the counter 525 exceeds a maximum quantity of rows of memory cells in the memory system. In either example, the memory system may determine that a value of the counter 525 satisfies the threshold and the clock signal 610 may transition in response to the value of the counter 525 satisfying the threshold. In some cases, the transition of the clock signal 610 from the voltage V0 to the voltage VDD may trigger the flip-flop circuit 605-a to propagate the value of the data input 620 to the output 625. Accordingly, the output 625 may transition from a first voltage V0 to a second voltage VDD.

At time 650, the counter 525 may roll over (e.g., the counter 525 may reset a value of the counter from a maximum value of the counter 525 to a minimum value of the counter 525). In response to resetting the counter (e.g., to a value that fails to satisfy the threshold), the clock signal 610 may transition from the voltage V1 to the voltage V0.

In between the time 645 and the time 655, the output 625 may propagate through the delay circuit 510 causing the data input 630 to transition from a first voltage V0 to V1. In some cases, propagating the output 625 through the delay circuit 510 to the data input 630 may occur after the time 650, when the clock signal 610 changes to the voltage V0. In some cases, the flip-flop circuit 605-b may refrain from propagating the value of the data input 630 to the output 635 based on the clock signal 610 being set to V0.

At time 655, the clock signal 610 may transition from the first voltage V0 to the second voltage V1 in response to the counter 525 satisfying the threshold for a second time since the memory system enters the self-refresh state at time 640. In some cases, the transition of the clock signal 610 from the voltage V0 to the voltage V1 may trigger the flip-flop circuit 605-b to propagate the value of the data input 630 to the output 635. Accordingly, the output 635 may transition from the first voltage V0 to the second voltage VDD. When the output 635 reaches the voltage level VDD the refresh circuit 515 may decrease the rate of refresh operations performed on the rows of memory cells.

At 660, the counter 525 may roll over (e.g., the counter 525 may reset a value of the counter from a maximum value of the counter 525 to a minimum value of the counter 525). In response to resetting the counter (e.g., to a value that fails to satisfy the threshold), the clock signal 610 may transition from the voltage V1 to the voltage V0.

At time 665, the memory system may exit the self-refresh state. In response to exiting the self-refresh state, the enable input signal 615 may transition from the second voltage level V3 to the first voltage level V2. The transition of the enable input signal 615 from the second voltage level V3 to the first voltage level V2 may trigger the flip-flop circuits 605 to reset. When the flip-flop circuits 605 reset, the output 625 and the output 635 may each transition from the voltage VDD to the voltage V0.

Although the timing diagram 600 illustrates the data input 620, the output 625, the data input 630, and the output 635 changing in relation to the rising edge of the clock signal 610 (e.g., transition from V0 to V1), in other implementations the inputs and outputs may change in relation to the falling edge of the clock signal 610 (e.g., transition from V1 to V0). Similarly, while the timing diagram 600 shows the enable input signal 615 triggering the flip-flop circuits 605 to reset on a falling edge (e.g., transition from V3 to V2), in other implementations the enable input signal 615 may trigger the flip-flop circuits 605 on a rising edge (e.g., a transition from V2 to V3).

Figure 7:
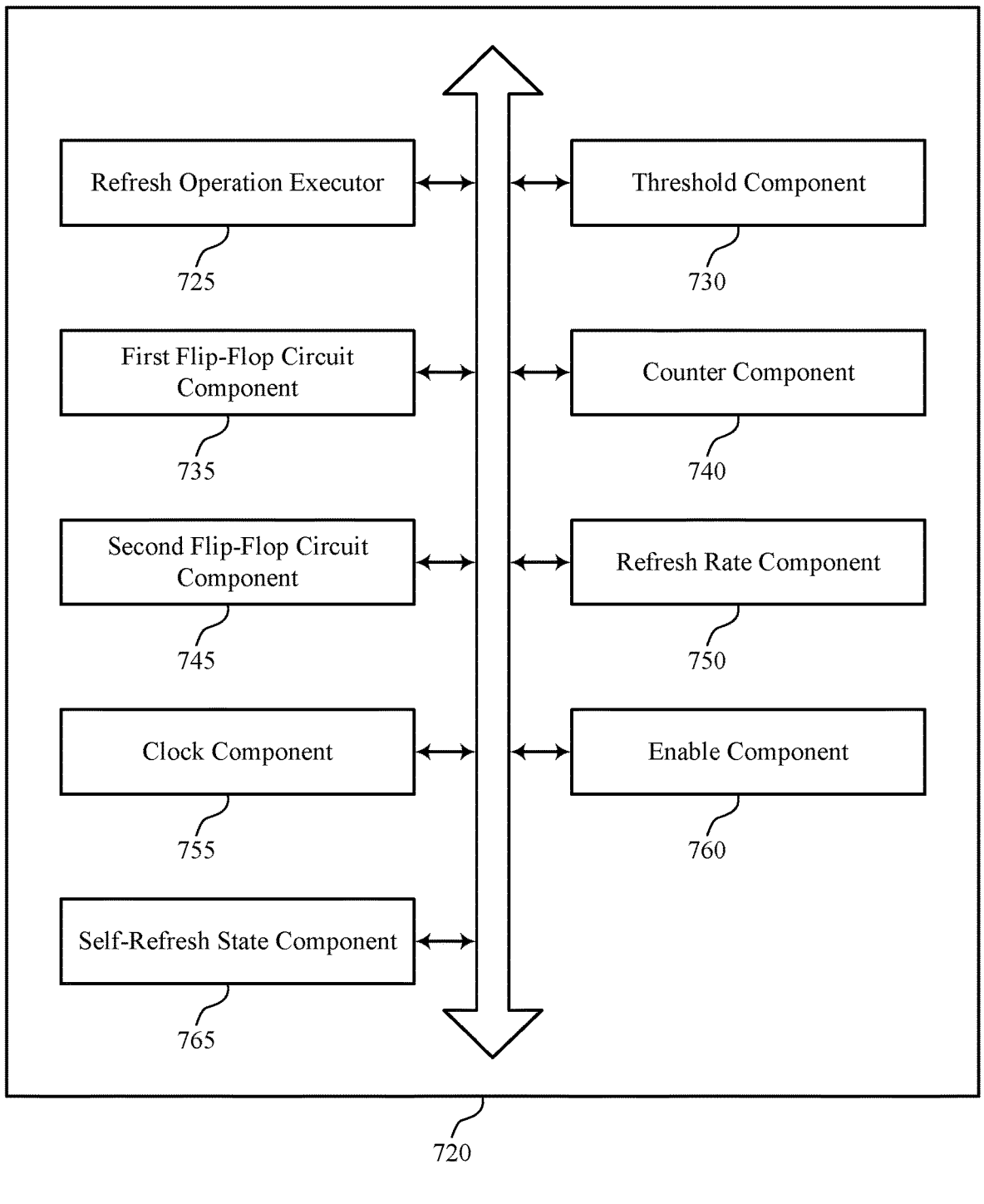
FIG. 7 shows a block diagram of a memory system that supports adjusting a refresh rate during a self-refresh state in accordance with examples as disclosed herein.

FIG. 7 shows a block diagram 700 of a memory system 720 that supports adjusting a refresh rate during a self-refresh state in accordance with examples as disclosed herein. The memory system 720 may be an example of aspects of a memory system as described with reference to FIGS. 1 through 6. The memory system 720, or various components thereof, may be an example of means for performing various aspects of adjusting a refresh rate during a self-refresh state as described herein. For example, the memory system 720 may include a refresh operation executor 725, a threshold component 730, a first flip-flop circuit component 735, a counter component 740, a second flip-flop circuit component 745, a refresh rate component 750, a clock component 755, an enable component 760, a self-refresh state component 765, or any combination thereof. Each of these components may communicate, directly or indirectly, with one another (e.g., via one or more buses).

The refresh operation executor 725 may be configured as or otherwise support a means for executing, while in a self-refresh state, a plurality of refresh operations on a plurality of rows of memory cells at a memory system according to a first rate for executing refresh operations. The threshold component 730 may be configured as or otherwise support a means for determining, based at least in part on executing a first subset of the plurality of refresh operations, that a counter associated with the plurality of refresh operations on the plurality of rows of memory cells satisfies a threshold a first time. The first flip-flop circuit component 735 may be configured as or otherwise support a means for modifying a first output of a first flip-flop circuit at the memory system from a first value to a second value based at least in part on determining that the counter satisfies the threshold the first time. The counter component 740 may be configured as or otherwise support a means for resetting the counter based at least in part on determining that the counter satisfies the threshold. In some examples, the threshold component 730 may be configured as or otherwise support a means for determining, after resetting the counter, that the counter satisfies the threshold a second time based at least in part on executing a second subset of the plurality of refresh operations. The second flip-flop circuit component 745 may be configured as or otherwise support a means for modifying a second output of a second flip-flop circuit at the memory system from the first value to the second value based at least in part on modifying the first output of the first flip-flop circuit to the second value and determining that the counter satisfies the threshold the second time. The refresh rate component 750 may be configured as or otherwise support a means for decreasing a rate for executing refresh operations in the self-refresh state from the first rate to a second rate based at least in part on modifying the second output of the second flip-flop circuit.

In some examples, to support modifying the first output of the first flip-flop circuit, the first flip-flop circuit component 735 may be configured as or otherwise support a means for coupling a data input of the first flip-flop circuit with a voltage supply based at least in part on entering the self-refresh state. In some examples, to support modifying the first output of the first flip-flop circuit, the clock component 755 may be configured as or otherwise support a means for applying a first signal to a clock input of the first flip-flop circuit based at least in part on determining that the counter satisfies the threshold the first time. In some examples, to support modifying the first output of the first flip-flop circuit, the second flip-flop circuit component 745 may be configured as or otherwise support a means for outputting a second signal from the first flip-flop circuit based at least in part on applying the first signal to the clock input of the first flip-flop circuit while the data input of the first flip-flop circuit is coupled with the voltage supply.

In some examples, to support modifying the second output of the second flip-flop circuit, the second flip-flop circuit component 745 may be configured as or otherwise support a means for applying the second signal to a data input of the second flip-flop circuit based at least in part on outputting the second signal from the first flip-flop circuit. In some examples, to support modifying the second output of the second flip-flop circuit, the clock component 755 may be configured as or otherwise support a means for applying the first signal to a clock input of the second flip-flop circuit based at least in part on determining that the counter satisfies the threshold the second time. In some examples, to support modifying the second output of the second flip-flop circuit, the second flip-flop circuit component 745 may be configured as or otherwise support a means for outputting a third signal from the second flip-flop circuit based at least in part on applying the first signal to the clock input of the second flip-flop circuit while applying the second signal to the data input of the second flip-flop circuit, where decreasing the rate for executing the refresh operations in the self-refresh state is based at least in part on outputting the third signal from the second flip-flop circuit.

In some examples, the clock component 755 may be configured as or otherwise support a means for applying a first signal to a clock input of the second flip-flop circuit based at least in part on determining that the counter satisfies the threshold the first time. In some examples, the second flip-flop circuit component 745 may be configured as or otherwise support a means for refraining from modifying the second output of the second flip-flop circuit in response to the applying the first signal to the clock input of the second flip-flop circuit based at least in part on a signal at a data input of the second flip-flop circuit being unchanged.

In some examples, the second flip-flop circuit component 745 may be configured as or otherwise support a means for applying, with a delay, the second value output by the first flip-flop circuit to the data input of the second flip-flop circuit based at least in part on modifying the first output of the first flip-flop circuit, where modifying the second output of the second flip-flop circuit is based at least in part on applying the second value output by the first flip-flop circuit to the data input of the second flip-flop circuit.

In some examples, the enable component 760 may be configured as or otherwise support a means for applying a signal to an enable input of the first flip-flop circuit while in the self-refresh state, where modifying the first output of the first flip-flop circuit is based at least in part on applying the signal to the enable input of the first flip-flop circuit.

In some examples, the self-refresh state component 765 may be configured as or otherwise support a means for exiting the self-refresh state based at least in part on decreasing the rate for executing refresh operations. In some examples, the enable component 760 may be configured as or otherwise support a means for refraining from applying the signal to the enable input of the first flip-flop circuit based at least in part on exiting the self-refresh state.

In some examples, the enable component 760 may be configured as or otherwise support a means for applying a signal to an enable input of the second flip-flop circuit based at least in part on entering the self-refresh state, where modifying the second output of the second flip-flop circuit is based at least in part on applying the signal to the enable input of the second flip-flop circuit.

In some examples, the self-refresh state component 765 may be configured as or otherwise support a means for exiting the self-refresh state based at least in part on decreasing the rate for executing refresh operations. In some examples, the enable component 760 may be configured as or otherwise support a means for refraining from applying the signal to the enable input of the second flip-flop circuit based at least in part on exiting the self-refresh state.

In some examples, the counter component 740 may be configured as or otherwise support a means for incrementing the counter based at least in part on executing each of the first subset of the plurality of refresh operations, where determining that the counter satisfies the threshold the first time is based at least in part on incrementing the counter. In some examples, the counter component 740 may be configured as or otherwise support a means for incrementing the counter after resetting the counter based at least in part on executing each of the second subset of the plurality of refresh operations, where determining that the counter satisfies the threshold the second time is based at least in part on incrementing the counter.

In some examples, each value of the counter indicates an address associated with one of the plurality of rows of memory cells. In some examples, executing the plurality of refresh operations on the plurality of rows of memory cells is based at least in part on the counter indicating a plurality of addresses associated with each of the plurality of rows of memory cells.

In some examples, the refresh operation executor 725 may be configured as or otherwise support a means for executing a second plurality of refresh operations on the plurality of rows of memory cells according to the second rate based at least in part on decreasing the rate for executing refresh operations in the self-refresh state.

In some examples, to support determining that the counter associated with performing refresh operations satisfies the threshold, the threshold component 730 may be configured as or otherwise support a means for determining that the counter is in an overflow condition.

In some examples, to support determining that the counter associated with performing refresh operations satisfies the threshold, the threshold component 730 may be configured as or otherwise support a means for determining that the counter exceeds a maximum quantity of rows associated with the memory system.

In some examples, the self-refresh state component 765 may be configured as or otherwise support a means for entering the self-refresh state. In some examples, the threshold component 730 may be configured as or otherwise support a means for determining an index of a row on which self-refresh operations are performed in response to entering the self-refresh state, where the threshold is based at least in part on the index of the row.

Figure 8:
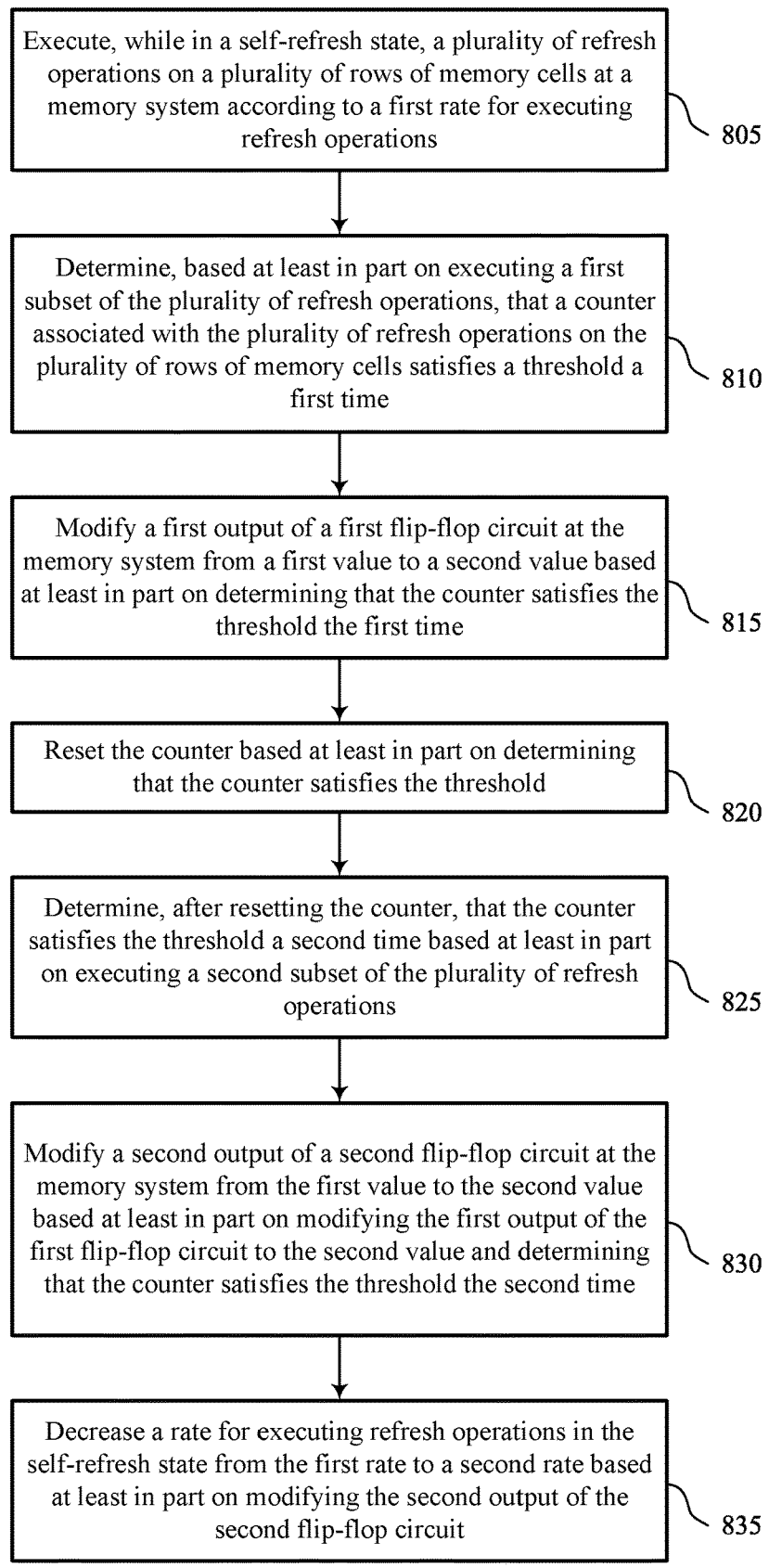
FIG. 8 shows a flowchart illustrating a method or methods that support adjusting a refresh rate during a self-refresh state in accordance with examples as disclosed herein.

FIG. 8 shows a flowchart illustrating a method 800 that supports adjusting a refresh rate during a self-refresh state in accordance with examples as disclosed herein. The operations of method 800 may be implemented by a memory system or its components as described herein. For example, the operations of method 800 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 805, the method may include executing, while in a self-refresh state, a plurality of refresh operations on a plurality of rows of memory cells at a memory system according to a first rate for executing refresh operations. The operations of 805 may be performed in accordance with examples as disclosed herein. In some examples, aspects of the operations of 805 may be performed by a refresh operation executor 725 as described with reference to FIG. 7.

At 810, the method may include determining, based at least in part on executing a first subset of the plurality of refresh operations, that a counter associated with the plurality of refresh operations on the plurality of rows of memory cells satisfies a threshold a first time. The operations of 810 may be performed in accordance with examples as disclosed herein. In some examples, aspects of the operations of 810 may be performed by a threshold component 730 as described with reference to FIG. 7.

At 815, the method may include modifying a first output of a first flip-flop circuit at the memory system from a first value to a second value based at least in part on determining that the counter satisfies the threshold the first time. The operations of 815 may be performed in accordance with examples as disclosed herein. In some examples, aspects of the operations of 815 may be performed by a first flip-flop circuit component 735 as described with reference to FIG. 7.

At 820, the method may include resetting the counter based at least in part on determining that the counter satisfies the threshold. The operations of 820 may be performed in accordance with examples as disclosed herein. In some examples, aspects of the operations of 820 may be performed by a counter component 740 as described with reference to FIG. 7.

At 825, the method may include determining, after resetting the counter, that the counter satisfies the threshold a second time based at least in part on executing a second subset of the plurality of refresh operations. The operations of 825 may be performed in accordance with examples as disclosed herein. In some examples, aspects of the operations of 825 may be performed by a threshold component 730 as described with reference to FIG. 7.

At 830, the method may include modifying a second output of a second flip-flop circuit at the memory system from the first value to the second value based at least in part on modifying the first output of the first flip-flop circuit to the second value and determining that the counter satisfies the threshold the second time. The operations of 830 may be performed in accordance with examples as disclosed herein. In some examples, aspects of the operations of 830 may be performed by a second flip-flop circuit component 745 as described with reference to FIG. 7.

At 835, the method may include decreasing a rate for executing refresh operations in the self-refresh state from the first rate to a second rate based at least in part on modifying the second output of the second flip-flop circuit. The operations of 835 may be performed in accordance with examples as disclosed herein. In some examples, aspects of the operations of 835 may be performed by a refresh rate component 750 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for executing, while in a self-refresh state, a plurality of refresh operations on a plurality of rows of memory cells at a memory system according to a first rate for executing refresh operations; determining, based at least in part on executing a first subset of the plurality of refresh operations, that a counter associated with the plurality of refresh operations on the plurality of rows of memory cells satisfies a threshold a first time; modifying a first output of a first flip-flop circuit at the memory system from a first value to a second value based at least in part on determining that the counter satisfies the threshold the first time; resetting the counter based at least in part on determining that the counter satisfies the threshold; determining, after resetting the counter, that the counter satisfies the threshold a second time based at least in part on executing a second subset of the plurality of refresh operations; modifying a second output of a second flip-flop circuit at the memory system from the first value to the second value based at least in part on modifying the first output of the first flip-flop circuit to the second value and determining that the counter satisfies the threshold the second time; and decreasing a rate for executing refresh operations in the self-refresh state from the first rate to a second rate based at least in part on modifying the second output of the second flip-flop circuit.

Aspect 2: The method, apparatus, or non-transitory computer-readable medium of aspect 1 where modifying the first output of the first flip-flop circuit includes operations, features, circuitry, logic, means, or instructions, or any combination thereof for coupling a data input of the first flip-flop circuit with a voltage supply based at least in part on entering the self-refresh state; applying a first signal to a clock input of the first flip-flop circuit based at least in part on determining that the counter satisfies the threshold the first time; and outputting a second signal from the first flip-flop circuit based at least in part on applying the first signal to the clock input of the first flip-flop circuit while the data input of the first flip-flop circuit is coupled with the voltage supply.

Aspect 3: The method, apparatus, or non-transitory computer-readable medium of aspect 2 where modifying the second output of the second flip-flop circuit includes operations, features, circuitry, logic, means, or instructions, or any combination thereof for applying the second signal to a data input of the second flip-flop circuit based at least in part on outputting the second signal from the first flip-flop circuit; applying the first signal to a clock input of the second flip-flop circuit based at least in part on determining that the counter satisfies the threshold the second time; and outputting a third signal from the second flip-flop circuit based at least in part on applying the first signal to the clock input of the second flip-flop circuit while applying the second signal to the data input of the second flip-flop circuit, where decreasing the rate for executing the refresh operations in the self-refresh state is based at least in part on outputting the third signal from the second flip-flop circuit.

Aspect 4: The method, apparatus, or non-transitory computer-readable medium of any of aspects 1 through 3, further including operations, features, circuitry, logic, means, or instructions, or any combination thereof for applying a first signal to a clock input of the second flip-flop circuit based at least in part on determining that the counter satisfies the threshold the first time and refraining from modifying the second output of the second flip-flop circuit in response to the applying the first signal to the clock input of the second flip-flop circuit based at least in part on a signal at a data input of the second flip-flop circuit being unchanged.

Aspect 5: The method, apparatus, or non-transitory computer-readable medium of aspect 4, further including operations, features, circuitry, logic, means, or instructions, or any combination thereof for applying, with a delay, the second value output by the first flip-flop circuit to the data input of the second flip-flop circuit based at least in part on modifying the first output of the first flip-flop circuit, where modifying the second output of the second flip-flop circuit is based at least in part on applying the second value output by the first flip-flop circuit to the data input of the second flip-flop circuit.

Aspect 6: The method, apparatus, or non-transitory computer-readable medium of any of aspects 1 through 5, further including operations, features, circuitry, logic, means, or instructions, or any combination thereof for applying a signal to an enable input of the first flip-flop circuit while in the self-refresh state, where modifying the first output of the first flip-flop circuit is based at least in part on applying the signal to the enable input of the first flip-flop circuit.

Aspect 7: The method, apparatus, or non-transitory computer-readable medium of aspect 6, further including operations, features, circuitry, logic, means, or instructions, or any combination thereof for exiting the self-refresh state based at least in part on decreasing the rate for executing refresh operations and refraining from applying the signal to the enable input of the first flip-flop circuit based at least in part on exiting the self-refresh state.

Aspect 8: The method, apparatus, or non-transitory computer-readable medium of any of aspects 1 through 7, further including operations, features, circuitry, logic, means, or instructions, or any combination thereof for applying a signal to an enable input of the second flip-flop circuit based at least in part on entering the self-refresh state, where modifying the second output of the second flip-flop circuit is based at least in part on applying the signal to the enable input of the second flip-flop circuit.

Aspect 9: The method, apparatus, or non-transitory computer-readable medium of aspect 8, further including operations, features, circuitry, logic, means, or instructions, or any combination thereof for exiting the self-refresh state based at least in part on decreasing the rate for executing refresh operations and refraining from applying the signal to the enable input of the second flip-flop circuit based at least in part on exiting the self-refresh state.

Aspect 10: The method, apparatus, or non-transitory computer-readable medium of any of aspects 1 through 9, further including operations, features, circuitry, logic, means, or instructions, or any combination thereof for incrementing the counter based at least in part on executing each of the first subset of the plurality of refresh operations, where determining that the counter satisfies the threshold the first time is based at least in part on incrementing the counter and incrementing the counter after resetting the counter based at least in part on executing each of the second subset of the plurality of refresh operations, where determining that the counter satisfies the threshold the second time is based at least in part on incrementing the counter.

Aspect 11: The method, apparatus, or non-transitory computer-readable medium of any of aspects 1 through 10 where each value of the counter indicates an address associated with one of the plurality of rows of memory cells and executing the plurality of refresh operations on the plurality of rows of memory cells is based at least in part on the counter indicating a plurality of addresses associated with each of the plurality of rows of memory cells.

Aspect 12: The method, apparatus, or non-transitory computer-readable medium of any of aspects 1 through 11, further including operations, features, circuitry, logic, means, or instructions, or any combination thereof for executing a second plurality of refresh operations on the plurality of rows of memory cells according to the second rate based at least in part on decreasing the rate for executing refresh operations in the self-refresh state.

Aspect 13: The method, apparatus, or non-transitory computer-readable medium of any of aspects 1 through 12 where determining that the counter associated with performing refresh operations satisfies the threshold includes operations, features, circuitry, logic, means, or instructions, or any combination thereof for determining that the counter is in an overflow condition.

Aspect 14: The method, apparatus, or non-transitory computer-readable medium of any of aspects 1 through 13 where determining that the counter associated with performing refresh operations satisfies the threshold includes operations, features, circuitry, logic, means, or instructions, or any combination thereof for determining that the counter exceeds a maximum quantity of rows associated with the memory system.

Aspect 15: The method, apparatus, or non-transitory computer-readable medium of any of aspects 1 through 14, further including operations, features, circuitry, logic, means, or instructions, or any combination thereof for entering the self-refresh state and determining an index of a row on which self-refresh operations are performed in response to entering the self-refresh state, where the threshold is based at least in part on the index of the row.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 16: An apparatus, including: a memory system including a plurality of rows of memory cells; a refresh circuit configured to execute, while the memory system is in a self-refresh state, a plurality of refresh operations on the plurality of rows of memory cells according to a first rate for executing refresh operations or a second rate for executing refresh operation; a counter configured to count a quantity of refresh operation performed on the plurality of rows of memory cells; and a refresh rate circuit configured to determine that the counter associated with the plurality of refresh operations on the plurality of rows of memory cells satisfies a threshold and decreasing a rate for executing the plurality of refresh operations from the first rate to the second rate based at least in part on determining that the counter satisfies the threshold.

Aspect 17: The apparatus of aspect 16, where the refresh rate circuit further includes: a first flip-flop circuit including a first data input, a first enable input, a first clock input, and a first output, the first data input coupled with a voltage supply, the first flip-flop circuit configured to modify the first output of the first flip-flop circuit from a first value to a second value based at least in part on determining that the counter satisfies the threshold a first time; and a second flip-flop circuit a second data input, a second enable input, a second clock input, and a second output, the second data input coupled with the first output of the first flip-flop circuit, the second flip-flop circuit configured to modify the second output of the second flip-flop circuit from the first value to the second value based at least in part on modifying the first output of the first flip-flop circuit to the second value and determining that the counter satisfies the threshold a second time.

Aspect 18: The apparatus of aspect 17, where the refresh rate circuit further includes: a delay circuit coupled with the first output of the first flip-flop circuit and the second data input of the second flip-flop circuit, the delay circuit configured to delay an application of the second value to the second data input of the second flip-flop circuit.

Aspect 19: The apparatus of any of aspects 17 through 18, where: a first signal is applied to the first enable input of the first flip-flop circuit and the second enable input of the first flip-flop circuit based at least in part on the memory system operating in the self-refresh state; and a second signal is applied to the first clock input of the first flip-flop circuit and the second clock input of the second flip-flop circuit based at least in part on the counter satisfying the threshold.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    executing, while in a self-refresh state, a plurality of refresh operations on a plurality of rows of memory cells at a memory system according to a first rate for executing refresh operations;
    determining, based at least in part on executing a first subset of the plurality of refresh operations, that a counter associated with the plurality of refresh operations on the plurality of rows of memory cells satisfies a threshold a first time;
    modifying a first output of a first flip-flop circuit at the memory system from a first value to a second value based at least in part on determining that the counter satisfies the threshold the first time;
    resetting the counter based at least in part on determining that the counter satisfies the threshold;
    determining, after resetting the counter, that the counter satisfies the threshold a second time based at least in part on executing a second subset of the plurality of refresh operations;
    modifying a second output of a second flip-flop circuit at the memory system from the first value to the second value based at least in part on modifying the first output of the first flip-flop circuit to the second value and determining that the counter satisfies the threshold the second time; and
    decreasing a rate for executing refresh operations in the self-refresh state from the first rate to a second rate based at least in part on modifying the second output of the second flip-flop circuit.

2. The method of claim 1, wherein modifying the first output of the first flip-flop circuit comprises:
    coupling a data input of the first flip-flop circuit with a voltage supply based at least in part on entering the self-refresh state;
    applying a first signal to a clock input of the first flip-flop circuit based at least in part on determining that the counter satisfies the threshold the first time; and
    outputting a second signal from the first flip-flop circuit based at least in part on applying the first signal to the clock input of the first flip-flop circuit while the data input of the first flip-flop circuit is coupled with the voltage supply.

3. The method of claim 2, wherein modifying the second output of the second flip-flop circuit comprises:
    applying the second signal to a data input of the second flip-flop circuit based at least in part on outputting the second signal from the first flip-flop circuit;

applying the first signal to a clock input of the second flip-flop circuit based at least in part on determining that the counter satisfies the threshold the second time; and outputting a third signal from the second flip-flop circuit based at least in part on applying the first signal to the clock input of the second flip-flop circuit while applying the second signal to the data input of the second flip-flop circuit, wherein decreasing the rate for executing the refresh operations in the self-refresh state is based at least in part on outputting the third signal from the second flip-flop circuit.

4. The method of claim 1, further comprising:

applying a first signal to a clock input of the second flip-flop circuit based at least in part on determining that the counter satisfies the threshold the first time; and refraining from modifying the second output of the second flip-flop circuit in response to the applying the first signal to the clock input of the second flip-flop circuit based at least in part on a signal at a data input of the second flip-flop circuit being unchanged.

5. The method of claim 4, further comprising:

applying, with a delay, the second value output by the first flip-flop circuit to the data input of the second flip-flop circuit based at least in part on modifying the first output of the first flip-flop circuit, wherein modifying the second output of the second flip-flop circuit is based at least in part on applying the second value output by the first flip-flop circuit to the data input of the second flip-flop circuit.

6. The method of claim 1, further comprising:

applying a signal to an enable input of the first flip-flop circuit while in the self-refresh state, wherein modifying the first output of the first flip-flop circuit is based at least in part on applying the signal to the enable input of the first flip-flop circuit.

7. The method of claim 6, further comprising:

exiting the self-refresh state based at least in part on decreasing the rate for executing refresh operations; and refraining from applying the signal to the enable input of the first flip-flop circuit based at least in part on exiting the self-refresh state.

8. The method of claim 1, further comprising:

applying a signal to an enable input of the second flip-flop circuit based at least in part on entering the self-refresh state, wherein modifying the second output of the second flip-flop circuit is based at least in part on applying the signal to the enable input of the second flip-flop circuit.

9. The method of claim 8, further comprising:

exiting the self-refresh state based at least in part on decreasing the rate for executing refresh operations; and refraining from applying the signal to the enable input of the second flip-flop circuit based at least in part on exiting the self-refresh state.

10. The method of claim 1, further comprising:

incrementing the counter based at least in part on executing each of the first subset of the plurality of refresh operations, wherein determining that the counter satisfies the threshold the first time is based at least in part on incrementing the counter; and incrementing the counter after resetting the counter based at least in part on executing each of the second subset of the plurality of refresh operations, wherein determining that the counter satisfies the threshold the second time is based at least in part on incrementing the counter.

11. The method of claim 1, wherein:

each value of the counter indicates an address associated with one of the plurality of rows of memory cells; and executing the plurality of refresh operations on the plurality of rows of memory cells is based at least in part on the counter indicating a plurality of addresses associated with each of the plurality of rows of memory cells.

12. The method of claim 1, further comprising:

executing a second plurality of refresh operations on the plurality of rows of memory cells according to the second rate based at least in part on decreasing the rate for executing refresh operations in the self-refresh state.

13. The method of claim 1, wherein determining that the counter associated with performing refresh operations satisfies the threshold comprises:

determining that the counter is in an overflow condition.

14. The method of claim 1, wherein determining that the counter associated with performing refresh operations satisfies the threshold comprises:

determining that the counter exceeds a maximum quantity of rows associated with the memory system.

15. The method of claim 1, further comprising:

entering the self-refresh state; and determining an index of a row on which self-refresh operations are performed in response to entering the self-refresh state, wherein the threshold is based at least in part on the index of the row.

16. An apparatus, comprising:

a memory system comprising a plurality of rows of memory cells;

a refresh circuit configured to execute, while the memory system is in a self-refresh state, a plurality of refresh operations on the plurality of rows of memory cells according to a first rate for executing refresh operations or a second rate for executing refresh operation;

a counter configured to count a quantity of the plurality of refresh operations performed on the plurality of rows of memory cells; and a refresh rate circuit configured to determine that a value of the counter satisfies a threshold and decreasing a rate for executing the plurality of refresh operations from the first rate to the second rate based at least in part on determining that the value of the counter satisfies the threshold.

17. The apparatus of claim 16, wherein the refresh rate circuit further comprises:

a first flip-flop circuit comprising a first data input, a first enable input, a first clock input, and a first output, the first data input coupled with a voltage supply, the first flip-flop circuit configured to modify the first output of the first flip-flop circuit from a first value to a second value based at least in part on determining that the counter satisfies the threshold a first time; and a second flip-flop circuit a second data input, a second enable input, a second clock input, and a second output, the second data input coupled with the first output of the first flip-flop circuit, the second flip-flop circuit configured to modify the second output of the second flip-flop circuit from the first value to the second value based at least in part on modifying the first output of the first flip-flop circuit to the second value and determining that the counter satisfies the threshold a second time.

18. The apparatus of claim 17, wherein the refresh rate circuit further comprises:
a delay circuit coupled with the first output of the first flip-flop circuit and the second data input of the second flip-flop circuit, the delay circuit configured to delay an application of the second value to the second data input of the second flip-flop circuit.

19. The apparatus of claim 17, wherein:
a first signal is applied to the first enable input of the first flip-flop circuit and the second enable input of the first flip-flop circuit based at least in part on the memory system operating in a self-refresh state; and
a second signal is applied to the first clock input of the first flip-flop circuit and the second clock input of the second flip-flop circuit based at least in part on the counter satisfying the threshold.

20. A non-transitory computer-readable medium storing code, the code comprising instructions executable by one or more processors to:
execute, while in a self-refresh state, a plurality of refresh operations on a plurality of rows of memory cells at a memory system according to a first rate for executing refresh operations;
determine, based at least in part on executing a first subset of the plurality of refresh operations, that a counter associated with the plurality of refresh operations on the plurality of rows of memory cells satisfies a threshold a first time;
modify a first output of a first flip-flop circuit at the memory system from a first value to a second value based at least in part on determining that the counter satisfies the threshold the first time;
reset the counter based at least in part on determining that the counter satisfies the threshold:
determine, after resetting the counter, that the counter satisfies the threshold a second time based at least in part on executing a second subset of the plurality of refresh operations;
modify a second output of a second flip-flop circuit at the memory system from the first value to the second value based at least in part on modifying the first output of the first flip-flop circuit to the second value and determining that the counter satisfies the threshold the second time; and
decrease a rate for executing refresh operations in the self-refresh state from the first rate to a second rate based at least in part on modifying the second output of the second flip-flop circuit.

* * * * *